(12) United States Patent
Terashima

(10) Patent No.: US 10,561,021 B2
(45) Date of Patent: Feb. 11, 2020

(54) POWER SEMICONDUCTOR MODULE AND POWER SEMICONDUCTOR DEVICE

(71) Applicant: FUJI ELECTRIC CO., LTD., Kanagawa (JP)

(72) Inventor: Kenshi Terashima, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/904,450

(22) Filed: Feb. 26, 2018

(65) Prior Publication Data

US 2018/0338376 A1 Nov. 22, 2018

(30) Foreign Application Priority Data

May 17, 2017 (JP) .................. 2017-098522

(51) Int. Cl.
*H05K 1/14* (2006.01)
*H01L 23/498* (2006.01)
(Continued)

(52) U.S. Cl.
CPC ........ *H05K 1/144* (2013.01); *H01L 23/49811* (2013.01); *H01L 25/162* (2013.01); *H05K 1/18* (2013.01); *H01R 12/58* (2013.01); *H05K 2201/042* (2013.01); *H05K 2201/09063* (2013.01); *H05K 2201/1081* (2013.01); *H05K 2201/10318* (2013.01); *H05K 2201/10787* (2013.01); *H05K 2201/10962* (2013.01); *H05K 2201/2027* (2013.01)

(58) Field of Classification Search
CPC .. H05K 1/144; H05K 1/18; H05K 2201/2036; H05K 2201/10303; H05K 2201/10015; H05K 2201/2027; H05K 2201/10962; H05K 2201/042; H05K 2201/09063; H05K 2201/10318; H05K 2201/10787; H05K 2201/1081; H05K 2203/167; H01L 23/49811; H01L 25/162; H01R 12/585; H01R 12/58; H01R 9/092
See application file for complete search history.

(56) References Cited

U.S. PATENT DOCUMENTS 5,563,770 A * 10/1996 Bethurum ............ G06K 19/077
257/679
6,995,461 B2 * 2/2006 Soyano ................. H01L 23/045
257/678
(Continued)

FOREIGN PATENT DOCUMENTS

| JP | 2004-327692 | * 11/2004 |
|---|---|---|
| JP | 2006-186144 | 7/2006 |
| JP | 2013-219633 | 10/2013 |

*Primary Examiner* — James Wu

(57) ABSTRACT

The area projections or a spacer occupies on the upper surface of a resin casing increases as the size of a power semiconductor module decreases, and therefore another means for defining a clearance between a control board and the resin casing is desired. A power semiconductor module is provided, including: a housing which houses a power semiconductor chip; and at least one control pin or guide pin which protrudes outward from an upper surface of the housing, wherein the at least one control pin or guide pin has at least one step in a height direction from the upper surface of the housing toward a tip farthest from the housing.

18 Claims, 17 Drawing Sheets

(51) Int. Cl.
  *H01L 25/16* (2006.01)
  *H05K 1/18* (2006.01)
  *H01R 12/58* (2011.01)

(56) References Cited

U.S. PATENT DOCUMENTS

| | | | |
|---|---|---|---|
| 10,062,621 B2* | 8/2018 | Spann | H01L 23/049 |
| 2005/0048850 A1* | 3/2005 | Zoller | B60R 16/0239 |
| | | | 439/761 |
| 2012/0074542 A1* | 3/2012 | Soyano | H01L 23/057 |
| | | | 257/659 |
| 2013/0285732 A1 | 10/2013 | Mori | |
| 2015/0201532 A1* | 7/2015 | Soyano | H05K 9/0037 |
| | | | 361/752 |

* cited by examiner (A)

(B)

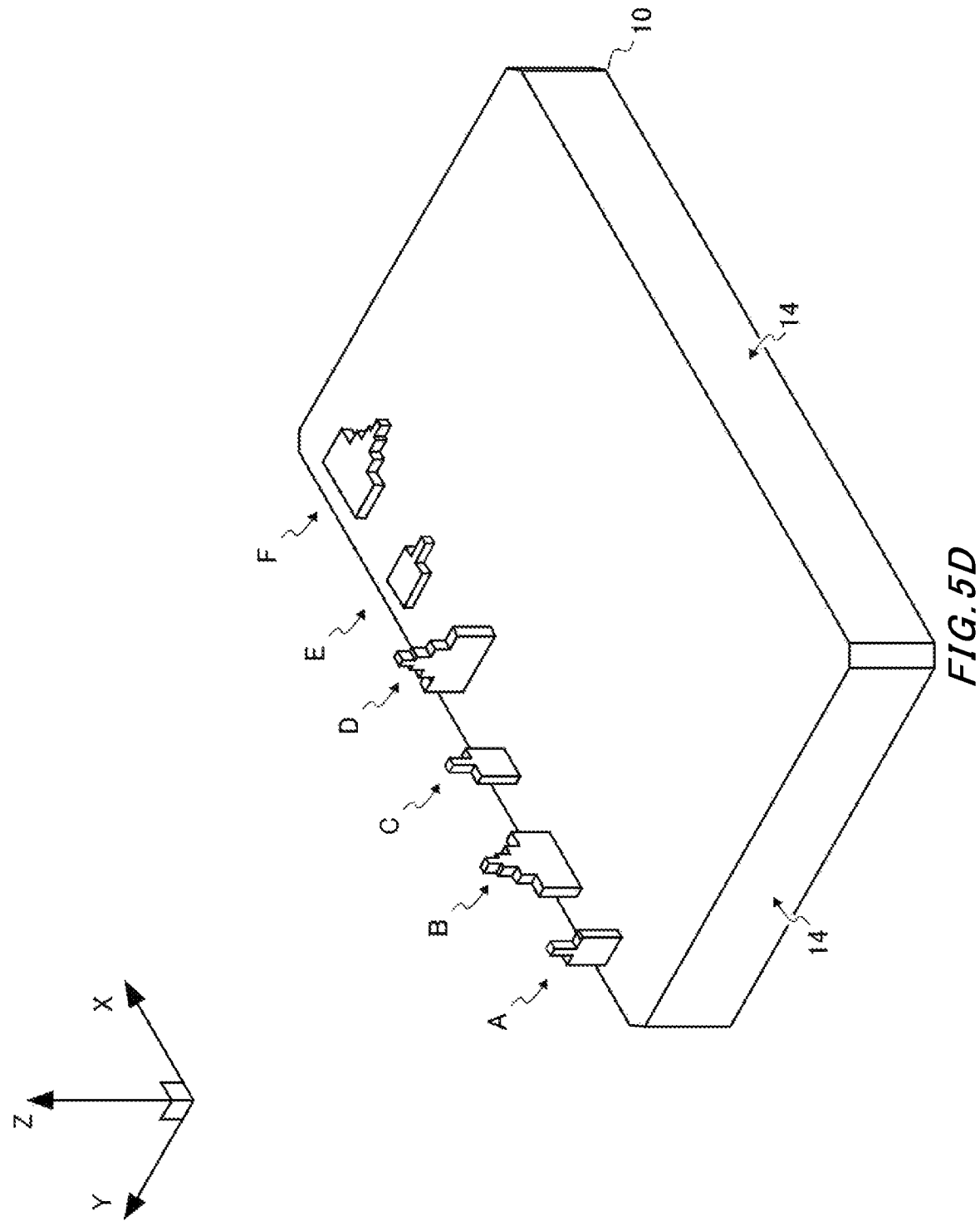

POWER SEMICONDUCTOR MODULE AND POWER SEMICONDUCTOR DEVICE

The contents of the following Japanese patent application are incorporated herein by reference:
NO. 2017-098522 filed in JP on May 17, 2017.

BACKGROUND

1. Technical Field

The present invention relates to a power semiconductor module and a power semiconductor device.

2. Related Art

Conventionally, step portions of connection pins have been provided inside a resin casing. Also, the step portions of the connection pins have been made to contact the lower-surface side of a control circuit board, and the entire control circuit board has been provided inside the resin casing (see Patent Document 1, for example).

Patent Document 1: Japanese Patent Application Publication No. 2006-186144

Besides the conventional example described above, projections or a spacer may be provided on the upper surface of a resin casing accommodating a power semiconductor module to define an interval between a control board provided above the resin casing and the resin casing. In this manner, a clearance can be provided between the back surface of the control board and the upper surface of the resin casing.

However, a region of the back surface of the control board corresponding to the projections or spacer restricts layout design of the control board. For example, wiring can not be provided in the region corresponding to the projections or spacer, and control pins protruding outward from the power semiconductor module and the control board can not electrically contact in the region. The area the projections or spacer occupies on the upper surface of the resin casing increases as the size of the power semiconductor module decreases, and therefore another means for defining a clearance between the control board and the resin casing is desired.

SUMMARY

A first aspect of the present invention provides a power semiconductor module. The power semiconductor module may include a housing and at least one control pin or guide pin. The housing may house the power semiconductor chip. The at least one control pin or guide pin may protrude outward from an upper surface of the housing. The at least one control pin or guide pin may have at least one step. The at least one step may be provided in a height direction from the upper surface of the housing toward a tip farthest from the housing.

The power semiconductor module may include at least one control pin having the at least one step.

The power semiconductor module may include a plurality of control pins each having at least one step in the height direction. The upper surface of the housing may have a first side and a second side opposing each other. The plurality of control pins may be arranged along the first side of the upper surface of the housing. The housing may have one or more projections. The one or more projections may be provided in a region closer to the second side than to the first side on upper surface and formed of resin.

A height position of a tip of each of the one or more projections may be same as a height position of the at least one step of each of the control pins.

The control pin may have two or more steps.

The power semiconductor module may include a plurality of control pins each having at least one step in the height direction. The plurality of control pins may include a first control pin and a second control pin. The first control pin may have a single step at a first height position. The second control pin may have a single step at a second height position that is different from the first height position.

The second height position may be lower than the first height position. The second control pin may be an alarm pin. The alarm pin may be used to inform outside of abnormality in the power semiconductor module.

The upper surface of the housing may have a first side and a second side opposing each other. The housing may have one or more projections. The one or more projections may be provided in a region closer to the second side than to the first side on the upper surface. The one or more projections may be formed of resin. Each of the one or more projections may have at least one step in the height direction.

The power semiconductor module may include a plurality of control pins each having at least one step in the height direction. The plurality of control pins may include a multi-step pin and a single-step pin. The multi-step pin may have two or more steps in the height direction. The multi-step pin may be provided at a corner of the upper surface of the housing. The multi-step pin may function as an alarm pin. The alarm pin may be used to inform outside of abnormality in the power semiconductor module. The single-step pin may have a single step. The single-step pin may not function as the alarm pin.

The power semiconductor module may include a plurality of control pins each having at least one step in the height direction. The plurality of control pins may include an alarm pin and a non-alarm pin. The alarm pin may have at least one step in the height direction. The alarm pin may be used to inform outside of abnormality in the power semiconductor module. The non-alarm pin may have a straight shape with no step. The non-alarm pin may have a function different from the alarm pin.

The power semiconductor module may include a plurality of control pins each having at least one step in the height direction. The plurality of control pins may include a plate-shaped pin. The plate-shaped pin may have a step only on one of four side surfaces.

The power semiconductor module may include a plurality of control pins each having at least one step in the height direction. The plurality of control pins may include a first control pin and a second control pin. The first control pin may have the at least one step. The at least one step may be provided at a first height position. The second control pin may have a convex portion. The convex portion may protrude in a direction orthogonal to the height direction at a same height position as the first height position.

The power semiconductor module may include a plurality of control pins each having at least one step in the height direction. The plurality of control pins may be arranged along a first direction. The plurality of control pins may include a plurality of plate-shaped pins. The plurality of plate-shaped pins may be longer in a second direction than in the first direction. The second direction may be orthogonal to the first direction as seen from above. The plurality of plate-shaped pins may each have at least one step protruding in the second direction.

The plurality of plate-shaped pins may include a first plate-shaped pin and a second plate-shaped pin. The first plate-shaped pin may have a step in a positive direction of the second direction. The second plate-shaped pin may has a shape different from the first plate-shaped pin. The second plate-shaped pin may have a step in a negative direction of the second direction.

The second plate-shaped pin may have a plurality of steps.

A second aspect of the present invention provides a power semiconductor device. The power semiconductor device may include the power semiconductor module as described above and a control board. The control board may have an opening provided in correspondence with the at least one control pin. The control board may contact the at least one control pin in the opening. The opening may be an ellipse or an oval as seen from above.

The summary clause does not necessarily describe all necessary features of the embodiments of the present invention. The present invention may also be a sub-combination of the features described above.

BRIEF DESCRIPTION OF THE DRAWINGS

FIG. 5D illustrates control pins 20 having steps 22 in the height direction.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
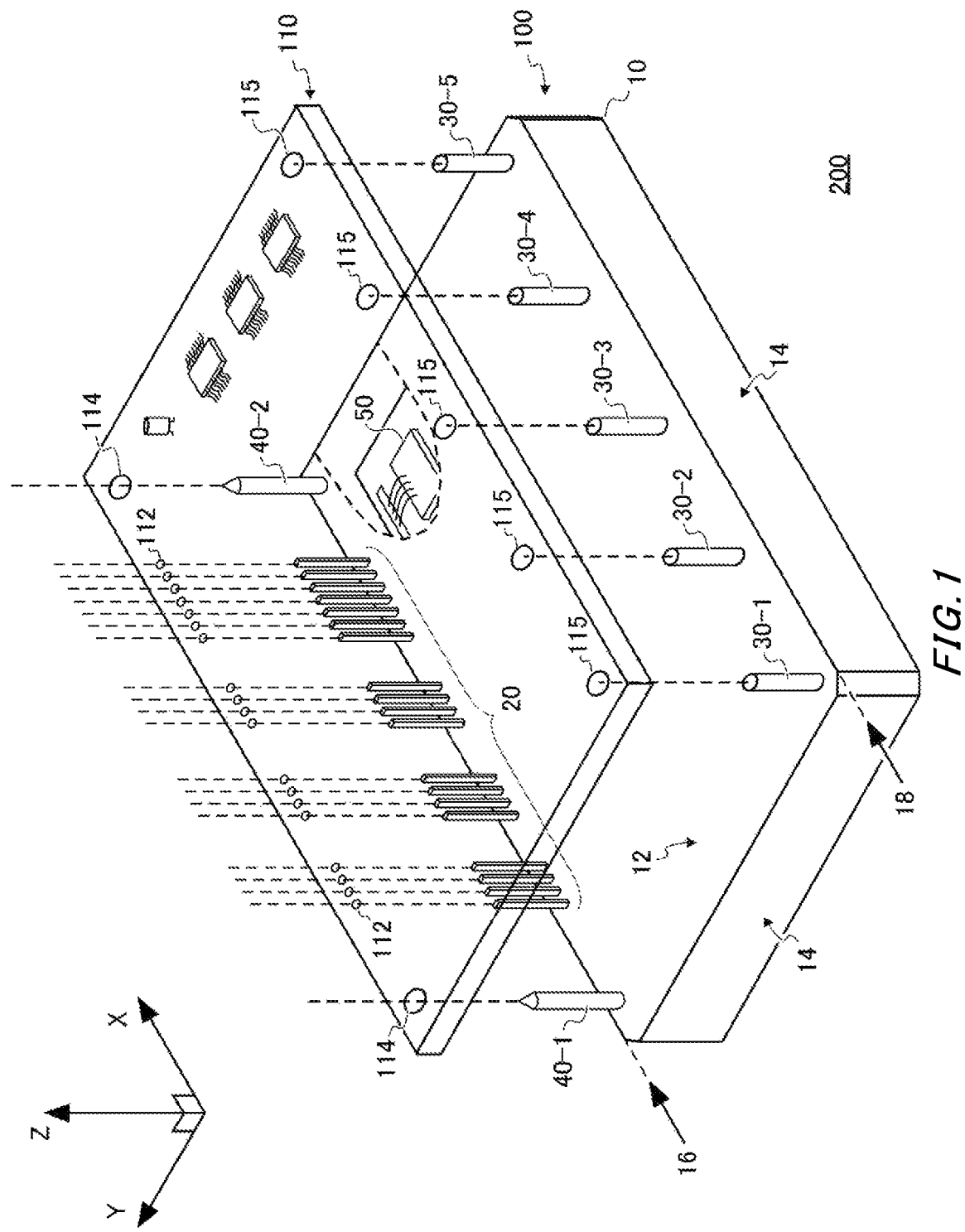
FIG. 1 is an exploded perspective view of a power semiconductor device 200 according to a first embodiment.

FIG. 1 is an exploded perspective view of a power semiconductor device 200 according to a first embodiment.

In FIG. 1, the X-axis direction and the Y-axis direction are directions perpendicular to each other, and the Z-axis direction is a direction perpendicular to the X-Y plane. The X-axis direction is an example of a first direction, and the Y-axis direction is an example of a second direction. X-axis, Y-axis and Z-axis form a so-called right-handed system. Also, in the present example, the positive Z-axis direction is referred to as an "upward" direction, and the negative Z-axis direction is referred to as a "downward" direction. Note that the positive Z-axis direction may also be referred to as a height direction. However, the "upward" and "downward" directions do not necessarily indicate the vertical direction relative to the ground. That is, the "upward" and "downward" directions are not limited to the gravitational direction. The words "upward" and "downward" are merely expedient expressions for identifying the relative positional relationship of components.

The power semiconductor device 200 of the present example includes a power semiconductor module 100 and a control board 110. The power semiconductor module 100 of the present example includes a housing 10 formed of resin, and a plurality of control pins 20 each protruding outward from the upper surface 12 of the housing 10, a plurality of main-current pins 30 and a plurality of guide pins 40.

The housing 10 may house therein one or more power semiconductor chips 50 and an insulated circuit board implemented with the one or more power semiconductor chips 50. The power semiconductor chip 50 is, for example, an IGBT (Insulated Gate Bipolar Transistor) chip. The power semiconductor module 100 of the present example is an intelligent power module having an insulated circuit board on which a plurality of IGBT chips, a plurality of FWD (Free Wheeling Diode) chips and a plurality of driver ICs are implemented. The power semiconductor module 100 may be used for a motor driving device of a general-purpose inverter, an air-conditioner or the like, and a power supply device of a UPS (Uninterruptible Power Supply), a PCS (Power Conditioning System) or the like.

The housing 10 may be a substantially rectangular parallelepiped. The housing 10 of the present example includes an upper surface 12, a plurality of side surfaces 14 and a bottom surface. The upper surface 12 of the housing 10 may have a first side 16 and a second side 18 opposing each other. The upper surface 12 of the housing 10 may be substantially rectangular. In the present example, the upper surface 12 of the housing 10 has a shape of a rectangle with chamfered corners. Also, the first side 16 and the second side 18 are both parallel to the X-axis direction on the upper surface 12.

The control pins 20, the main-current pins 30 and the guide pins 40 extend from the inside of the housing 10 and protrude outward from the upper surface 12 of the housing 10. The control pins 20, the main-current pins 30 and the guide pins 40 may be fixed to the housing 10 with resin constituting the housing 10. The resin constituting the housing 10 is, for example, a PPS (Poly Phenylene Sulfide) resin.

In the present example, guide pins 40-1 and 40-2 are arranged respectively in the vicinity of both ends of the first side 16. The guide pins 40 may be used for positioning in assembling the power semiconductor module 100 and the control board 110 with each other. The guide pins 40 of the present example do not output an electrical signal from the power semiconductor module 100 to the outside. The guide pins 40 may be electrically insulated from the circuit and wiring of the power semiconductor module 100. For example, the guide pins 40 are formed of brass.

The plurality of control pins 20 may be arranged along the first side 16. In the present example, the plurality of control pins 20 form groups of four, four, four and seven, respectively, and are arranged along the first side 16, between the guide pins 40-1 and 40-2. In the present example, a plurality of control pins 20 of one group are also arranged along the first side 16. The control pins 20 may be electrically connected to the driver IC. The driver IC may control operation of an IGBT. Each of the plurality of control pins 20 may correspond to any of a supply voltage pin, a gate control pin, a ground pin and an alarm pin.

The supply voltage pin may be used to supply a supply voltage for driving the driver IC of the power semiconductor module 100. The gate control pin may be used to supply a control signal to turn on/off a gate of an IGBT. The ground pin may be used to supply a ground potential to an emitter of an IGBT and an anode of an FWD. The alarm pin may be used to inform the outside of abnormality in the power semiconductor module 100. A control pin 20 is formed by nickel-plating the surface of the body formed of copper and further gold-plating or tin-plating the nickel-plated layer in an overlayered manner, for example.

The plurality of main-current pins 30 may be arranged along the second side 18. In the present example, five main-current pins 30 are arranged along the second side 18. The main-current pins 30 may be electrically connected to an IGBT and an FWD. For example, main-current pins 30-1 and 30-5 respectively function as a P terminal and an N terminal, which are main supply terminals. Also, for example, main-current pins 30-2, 30-3 and 30-4 respectively function as a U-phase terminal, a V-phase terminal and a W-phase terminal, which are three-phase output terminals. The main-current pins 30 of the present example do not have a step contacting the back surface of the control board 110. However, in other examples, the main-current pins 30 may have a step contacting the back surface of the control board 110.

The control board 110 may have openings through which the control pins 20, the guide pins 40 and the main-current pins 30 can penetrate, at positions corresponding to the positions of these pins in the Z-axis direction. The control board 110 of the present example has openings 112 provided corresponding to the control pins 20, openings 114 provided corresponding to the guide pins 40, and openings 115 provided corresponding to the main-current pins 30. The X-axis direction lengths of the openings 112 or the openings 114 may be appropriately adjusted such that the control board 110 contacts the steps of the control pins 20 or the guide pins 40. On the other hand, the openings 115 of the present example are not involved in defining a clearance, and may have a size that allows the main-current pins 30 to penetrate therethrough. For example, the sizes of the main-current pins 30 and the openings 115 in the X-Y plane substantially coincide with each other.

The control board 110 has a capacitor, an IC chip, metal wiring and the like on at least one of its front surface (i.e. a surface in the positive Z-axis direction) and back surface (i.e. a surface in the negative Z-axis direction). However, in FIG. 1, structural details of the control board 110 are omitted except for the openings 112, 114 and 115 and a capacitor and an IC chip in the vicinity of the positive X-axis direction end of the front surface, for easy understanding. Also, the outline of the control board 110 is indicated by solid lines.

Figure 2A:
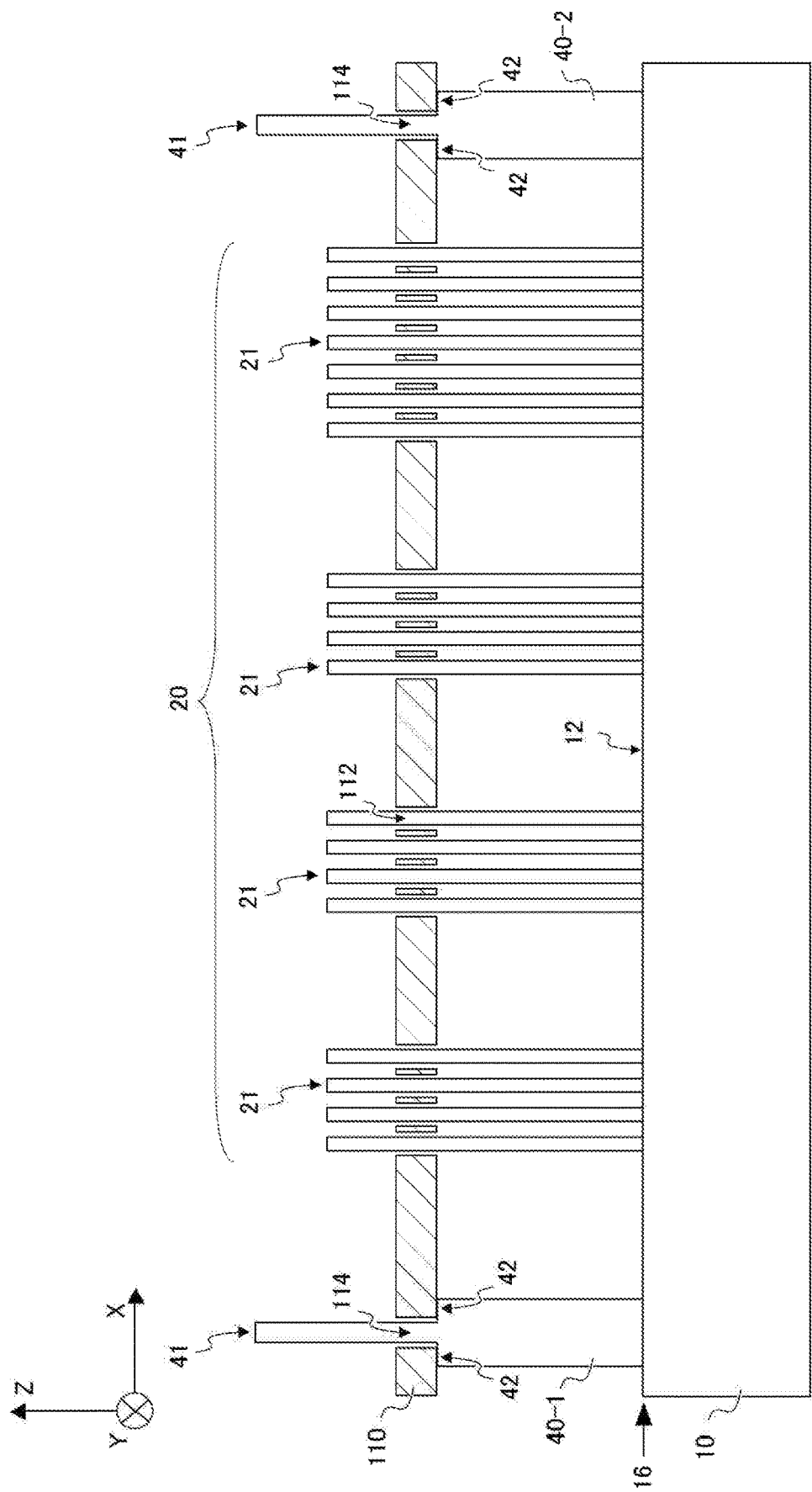
FIG. 2A shows an example where a step is provided to a guide pin 40.

In FIG. 2A to FIG. 8, arrangement and the shapes of the control pins 20, the guide pins 40 and the like are described. FIG. 2A shows an example where a step is provided to a guide pin 40. Note that, in the example of FIG. 2A, the control pins 20 do not have a step. At least one guide pin 40 may have at least one step 42 in the height direction. In the present example, all the (two) guide pins 40 each have a single step 42 in the height direction.

Note that, in this specification, the number of steps in the height direction refers to the number of steps provided at different positions in the height direction. For example, FIG. 2A is shown such that steps 42 are at two parts of one guide pin 40 in the X-axis direction, but the steps 42 at the two parts are at the same height position. In this case, the number of steps 42 of the guide pin 40 in the height direction may be counted as one. Note that a tip 41 of a guide pin 40 or a tip 21 of a control pin 20 is considered as being different from the step 42 of the guide pin 40 or the step of the control pin 20. Also, in this specification, the height direction refers to a direction from the upper surface 12 of the housing 10 toward the tips 41 of the guide pins 40 or the tips 21 of the control pins 20 that are farthest from the housing 10.

Each guide pin 40 may be a cylindrical-shaped pin having a step 42. For example, each guide pin 40 includes a first cylindrical portion having a diameter of a first length in the X-Y cross section, and a second cylindrical portion having a diameter of a second length that is smaller than the first length in the X-Y cross section and provided on the first cylindrical portion. A step 42 may be formed by arranging the first cylindrical portion and the second cylindrical portion in a concentric manner. The size of an opening 114 in the X-axis direction may be greater than the diameter of the second cylindrical portion and smaller than the diameter of the first cylindrical portion. The size of an opening 114 of the present example is greater than the X-axis direction length of the guide pin 40 at its tip 41 and smaller than the X-axis direction length of the guide pin 40 at a height position where the step 42 is provided. Also, in the present example, a side surface of a guide pin 40 from the tip 41 to the step 42 is parallel to the Y-Z plane.

The steps 42 of the guide pins 40 may contact the back surface of the control board 110. The control board 110 is supported by the housing 10, and therefore the clearance between the upper surface 12 of the housing 10 and the back surface of the control board 110 can be defined. Note that the guide pins 40 contact the inner surfaces of the openings 114, and therefore it is also possible to fix the control board 110 in the X-Y plane direction by the guide pins 40. Regarding this point, see also FIG. 5B (A) and its corresponding descriptions mentioned later.

In the present example, the clearance between the housing 10 and the control board 110 is defined by the guide pins 40, and the clearance is not defined by projections of resin protruding from the upper surface 12. In the present example, the control pins 20 and the control board 110 can be electrically connected to each other in a region where the control pins 20 are provided. Therefore, restriction on layout design can be reduced compared to the case where the clearance between the housing 10 and the control board 110 is defined only by projections of resin.

In the example of FIG. 2A, the X-axis direction length of a guide pin 40 in the vicinity of its tip 41 is smaller than the X-axis direction length of the guide pin 40 at its bottom. In this manner, the step 42 is formed in the guide pin 40. However, the step 42 of the guide pin 40 may be formed instead by making the Y-axis direction length of the guide pin 40 in the vicinity of its tip 41 smaller than the Y-axis direction length of the guide pin 40 at its bottom.

Figure 2B:
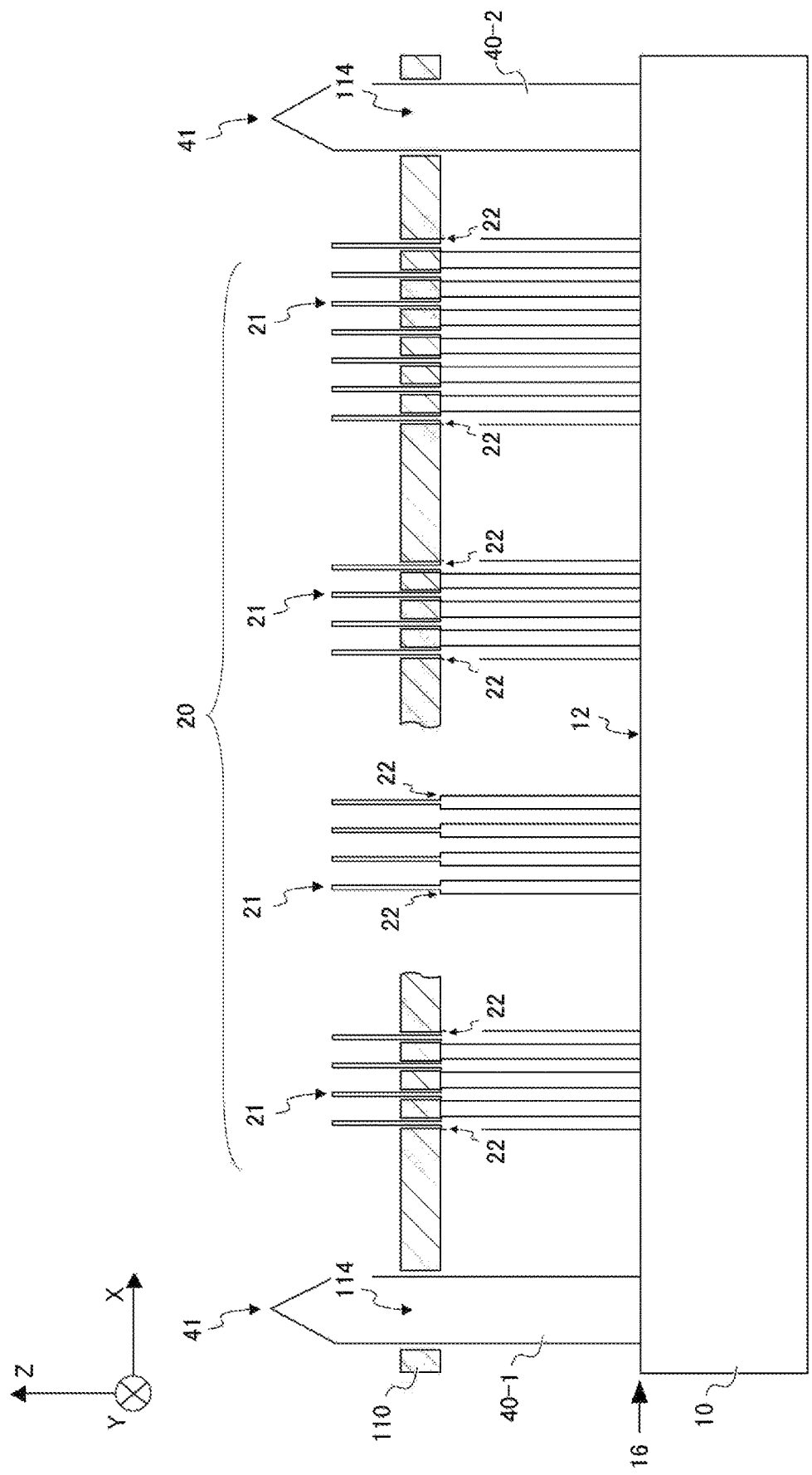
FIG. 2B shows an example where a step is provided to a control pin 20.

FIG. 2B shows an example where a step is provided to a control pin 20. Note that, in the example of FIG. 2B, the guide pins 40 do not have a step 42. The control board 110 is partially omitted for the purpose of easy viewing of the step 22 of the control pin 20.

At least one control pin 20 may have at least one step 22 in the height direction. In the present example, each of all the (nineteen (=4+4+4+7)) control pins 20 has a single step 22 in the height direction. The steps 22 of the control pins 20 may contact the back surface of the control board 110. In this manner, the control board 110 is supported by the housing 10, and therefore the clearance between the upper surface 12 of the housing 10 and the back surface of the control board 110 can be defined.

Each control pin 20 may be a cylindrical-shaped pin having a step 22. For example, each control pin 20 includes a third cylindrical portion having a diameter of a third length in the X-Y cross section, and a fourth cylindrical portion having a diameter of a fourth length that is smaller than the third length in the X-Y cross section and provided on the third cylindrical portion. A step 22 may be formed by arranging the third cylindrical portion and the fourth cylindrical portion in a concentric manner. However, each control pin 20 having the step 22 may have an elliptical cylindrical shape, or may have a plate shape. The size of an opening 112 in the X-axis direction may be greater than the diameter of the fourth cylindrical portion and smaller than the diameter of the third cylindrical portion. The size of an opening 112 of the present example is greater than the X-axis direction length of the control pin 20 at its tip 21 and smaller than the X-axis direction length of the control pin 20 at a height position where the step 22 is provided. Also, in the present example, a side surface of a control pin 20 from the tip 21 to the step 22 is parallel to the Y-Z plane. The X-axis direction length of each control pin 20 may be smaller than the X-axis direction length of each guide pin 40. Correspondingly, the X-axis direction length of each opening 112 may be smaller than the X-axis direction length of each opening 114.

Unlike the control pins 20, the guide pins 40 are essentially used to align the power semiconductor module 100 and the control board 110 with each other. Therefore, it is preferable not to provide a step 42 to the guide pins 40. In the present example, the clearance between the upper surface 12 of the housing 10 and the back surface of the control board 110 can be defined by the steps 22 of the control pins 20, and the essential positioning function of the guide pins 40 can be ensured as a step 42 is not provided to the guide pins 40. Also, in the present example as well, restriction on layout design can be reduced compared to the case where the clearance is defined only by projections of resin.

In the case where the control pins 20 have an elliptical cylindrical shape or a plate shape, a step 22 may be formed in a control pin 20 by making the X-axis direction length of the control pin 20 in the vicinity of its tip 21 smaller than the X-axis direction length of the control pin 20 at its bottom. However, a step 22 may be formed in a control pin 20 instead by making the Y-axis direction length of the control pin 20 in the vicinity of its tip 21 smaller than the Y-axis direction length of the control pin 20 at its bottom.

Figure 3:
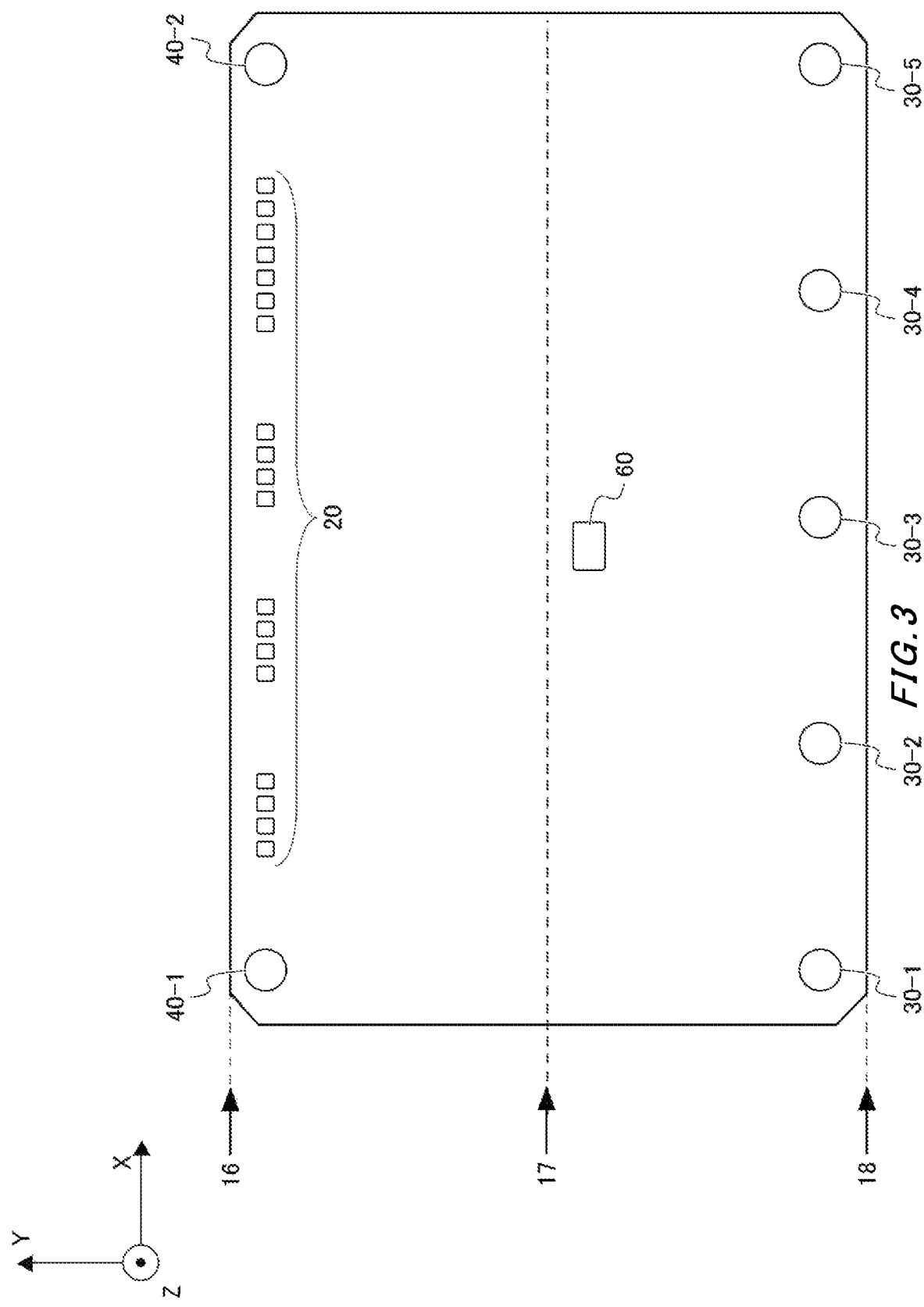
FIG. 3 shows an upper surface 12 of a housing 10.

FIG. 3 shows the upper surface 12 of the housing 10. The power semiconductor module 100 of the present example includes one or more projections 60 protruding in the height direction on the upper surface 12 of the housing 10, in addition to the control pins 20, the main-current pins 30 and the guide pins 40. The present example is different from the above-described examples in that point. The power semiconductor module 100 of the present example includes one projection 60, but the power semiconductor module 100 may include a plurality of projections 60 arranged along the X-axis direction in other examples. The projection 60 may be provided in a region closer to the second side 18 than to the first side 16. More specifically, the projection 60 may be provided at a position between a center line 17 and the second side 18. Note that the center line 17 is an imaginary line positioned at an equal distance from the first side 16 and the second side 18. Note that the projection 60 may be formed of resin. For example, the projection 60 may be formed of the same resin as the housing 10.

If the clearance between the housing 10 and the control board 110 is defined by the steps 22 of the control pins 20 or the steps 42 of the guide pins 40, it may be difficult to support the control board 110 in a well-balanced manner. In the present example, the control board 110 can be supported at three points, all of which are not positioned on the same straight line, by virtue of providing the projection 60. In this manner, backlash of the control board 110 in the height direction can be reduced, and the control board 110 can further be supported in a well-balanced manner.

Figure 4:
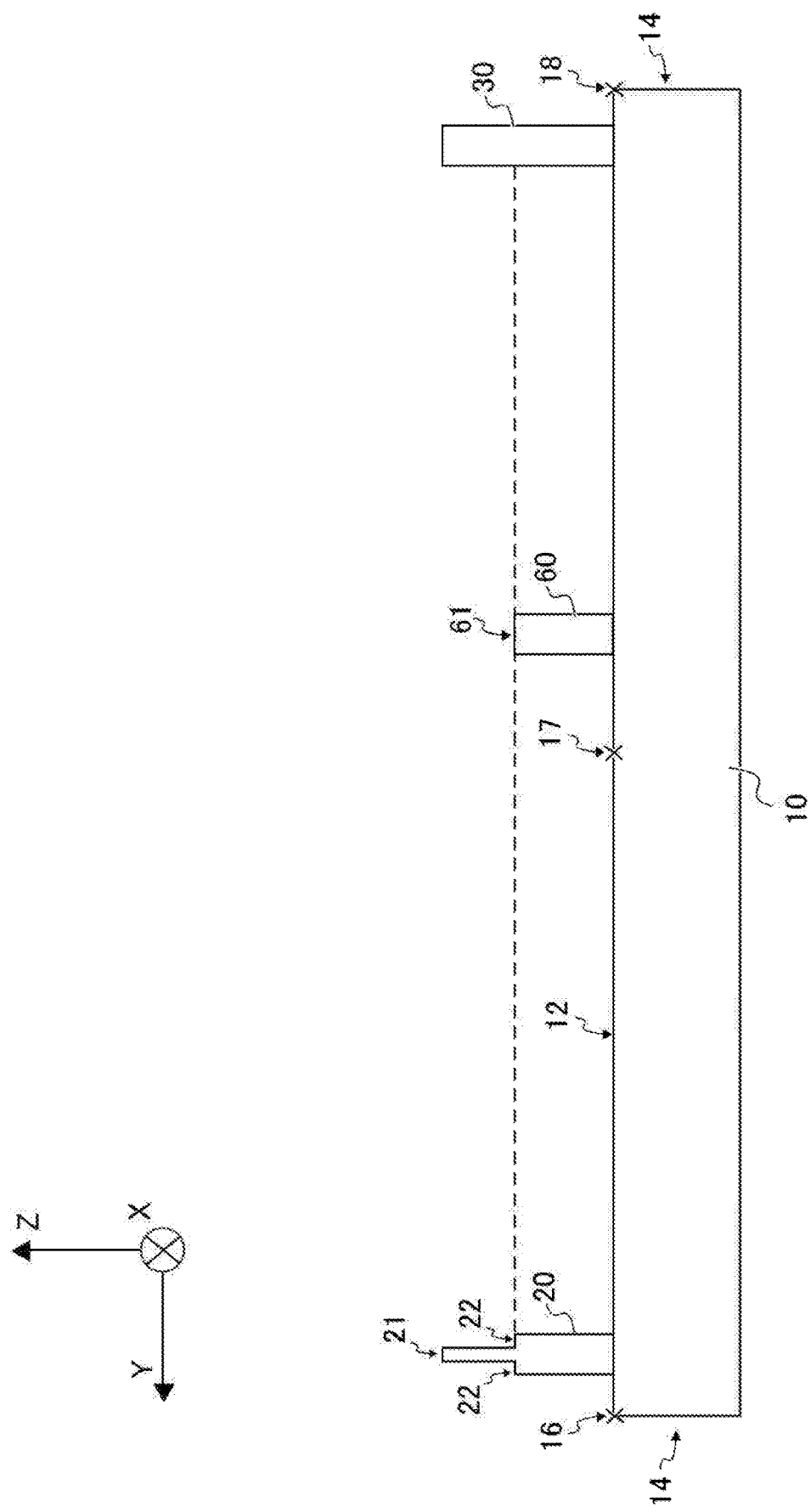
FIG. 4 illustrates the height positions of a step 22 of a control pin 20 and a tip 61 of a projection 60.

FIG. 4 illustrates the height positions of a step 22 of a control pin 20 and a tip 61 of a projection 60. FIG. 4 is also a view of a side surface 14 of the housing 10 in FIG. 3 as seen in the X-axis direction. In the present example, the height position of the tip 61 of the projection 60 is the same as the height position of the step 22 of the control pin 20. In this manner, the clearance between the housing 10 and the control board 110 can be made more uniform in the entire X-Y plane compared to the examples of FIG. 1, FIG. 2A and FIG. 2B.

Figure 5A:
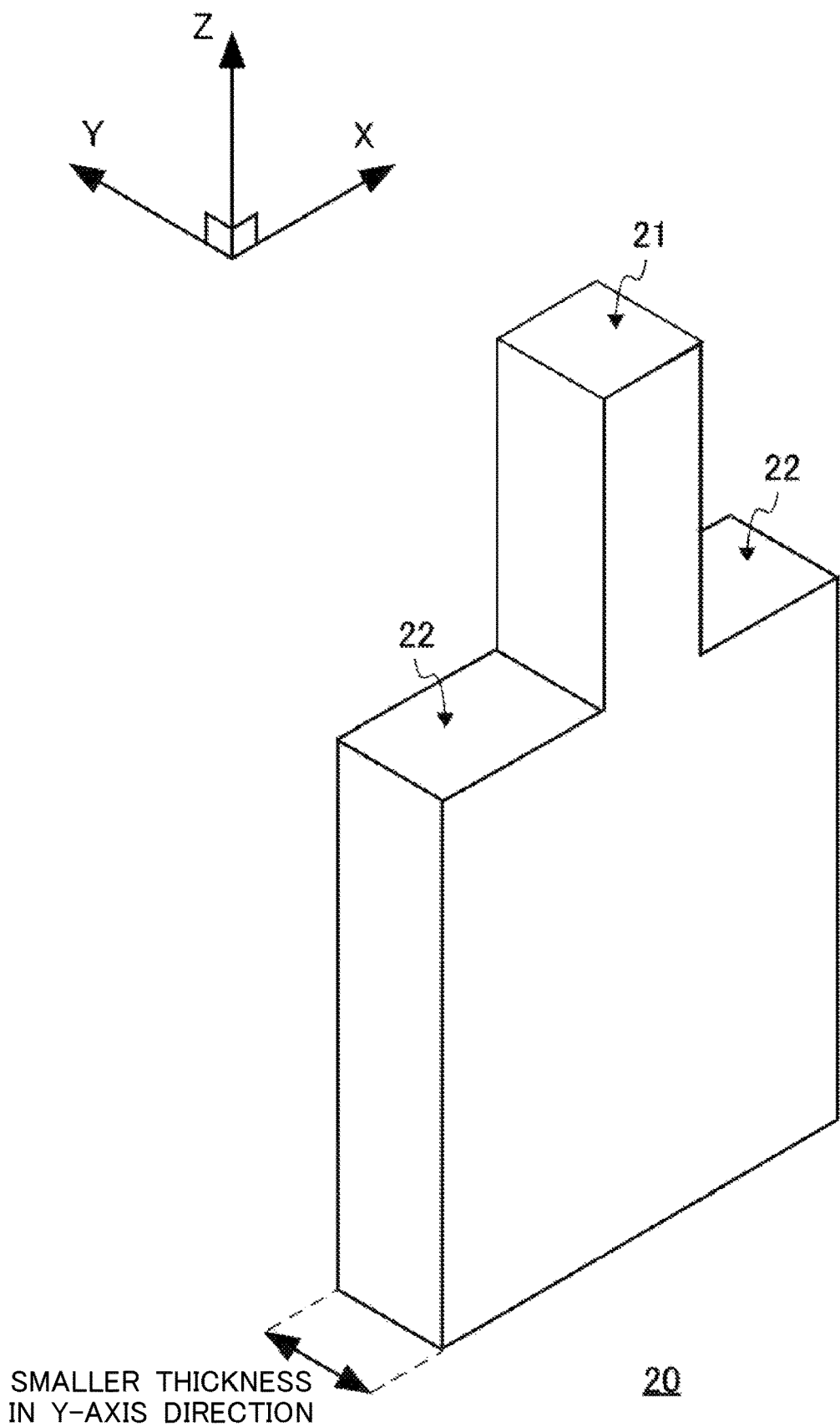
FIG. 5A is a perspective view of a control pin 20 having a single step 22.

FIG. 5A is a perspective view of a control pin 20 having a single step 22. The control pin 20 may have a plate shape. The control pin 20 of the present example has a plate shape having a smaller thickness in the Y-axis direction. In a view of the control pin 20 of the present example as seen from above, the step 22 provided at two different positions in the X-axis direction and the tip 21 are arranged in a straight line in the X-axis direction.

However, in other examples, the control pin 20 may have a plate shape having a smaller thickness in the X-axis direction. If the control pin 20 has a plate shape having a smaller thickness in the X-axis direction, it is advantageous in that the plurality of control pins 20 arranged along the X-axis direction can be arranged at narrow pitches, compared to the case where the control pin 20 has a plate shape having a smaller thickness in the Y-axis direction.

Figure 5B:
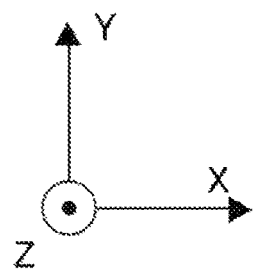
FIG. 5B shows a top view (A) of a control pin 20 and an opening 112, and a cross-sectional view (B) of the control pin 20 and the opening 112 taken along A-A.
Figure 5B:
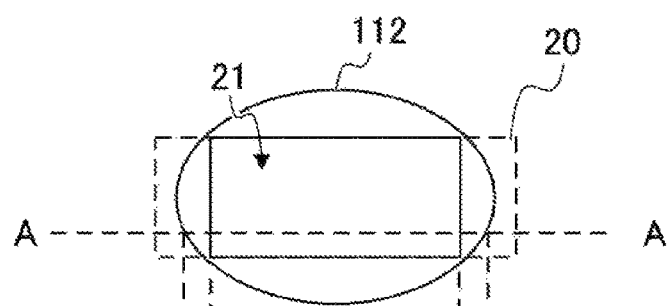
Figure 5B:
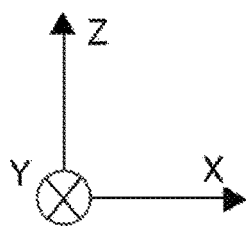
Figure 5B:
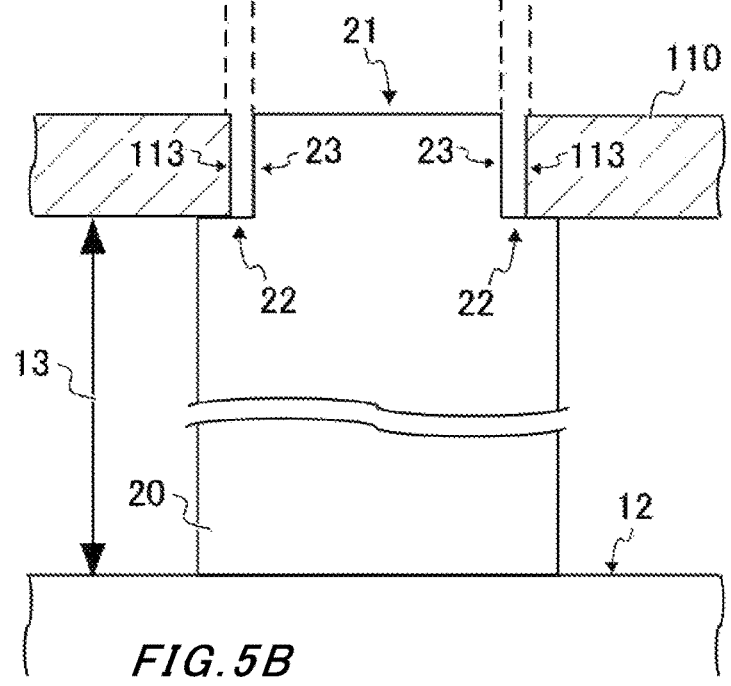

FIG. 5B (A) is a top view of a control pin 20 and an opening 112. The control pin 20 of the present example has a plate shape having a smaller thickness in the Y-axis direction. The opening 112 may be a through hole having an elliptical or oval shape as seen from above. The opening 112 of the present example is longer in the X-axis direction than in the Y-axis direction. The control pin 20 may contact the inner surface of the opening 112. In this manner, the relative positions of the housing 10 and the control board 110 can be fixed in the X-Y plane.

FIG. 5B (B) is a cross-sectional view of the control pin 20 and the opening 112 taken along A-A in FIG. 5B (A). A clearance 13 between the back surface of the control board 110 and the upper surface 12 of the housing 10 may be defined by the step 22. In FIG. 5B (B), a clearance between the control pin 20 and the control board 110 in the opening 112 may also be formed. The clearance may be defined by an inner surface 113 of the opening 112 of the control board 110 and a tip side surface 23 of the control pin 20. The tip side surface 23 may be a side surface that is parallel to the Y-Z plane and is at least partially positioned in the opening 112 and is positioned between the tip 21 and the step 22.

Note that the control pin 20 of the present example has a plate shape having a smaller thickness in the Y-axis direction, but the control pin 20 may have a plate shape having a smaller thickness in the X-axis direction in other examples. The ellipse or oval of the opening 112 may be longer in the X-axis direction or may be longer in the Y-axis direction depending on the shape of the control pin 20.

Figure 5C:
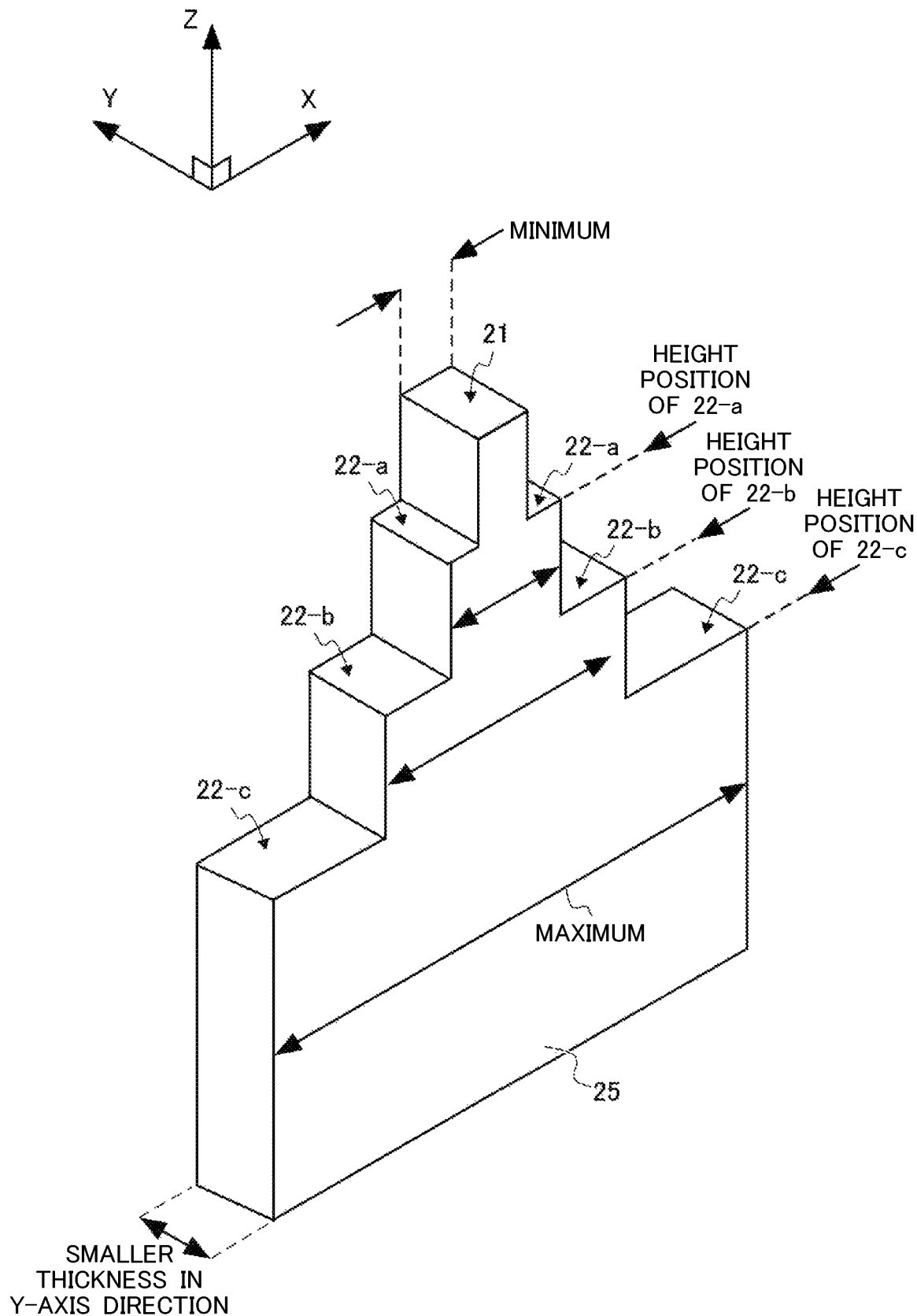
FIG. 5C is a perspective view of a control pin 20 having two or more steps 22.

FIG. 5C is a perspective view of a control pin 20 having two or more steps 22. The control pin 20 of the present example also has a plate shape having a smaller thickness in the Y-axis direction. The control pin 20 of the present example is a multi-step pin 25 having, in the positive and negative X-axis directions, a plurality of steps 22-*a*, 22-*b* and 22-*c* provided at different height positions. The step 22-*a* is at the highest position next to the tip 21. The step 22-*b* is at the highest position next to the step 22-*a*, and the step 22-*c* is at the lowest position.

A control pin 20 having its step 22 at a higher position may have a smaller X-axis direction length. In the present example, the X-axis direction length of the tip 21 may define the minimum length of the control pin 20 in the major-axis direction of the opening 112. The X-axis direction length at the height position of the step 22-*a* may define the second smallest length of the control pin 20 in the major-axis direction of the opening 112. Similarly, the X-axis direction length at the height position of the step 22-*b* may define the third smallest length of the control pin 20, and the X-axis direction length at the height position of the step 22-*c* may define the maximum length of the control pin 20.

In the present example, the height position at which the control board 110 and the step 22 contact can be adjusted by adjusting the size of the opening 112. That is, the clearance 13 between the control board 110 and the housing 10 can be adjusted by adjusting the size of the opening 112.

However, in other examples, the control pin 20 may have a plate shape having a smaller thickness in the X-axis direction. If the control pin 20 has a plate shape having a smaller thickness in the X-axis direction, it is advantageous in that the plurality of control pins 20 arranged along the X-axis direction can be arranged at narrow pitches, compared to the case where the control pin 20 has a plate shape having a smaller thickness in the Y-axis direction.

In an example, the height position of the control board 110 is adjusted in a range of 1 mm or more and 2 mm or less. Correspondingly, the length between the step 22-*a* and the step 22-*c* in a direction parallel to the Z-axis direction may be in a range of 1 mm or more and 2 mm or less.

FIG. 5D illustrates control pins 20 having steps 22 in the height direction. The expression "the control pins 20 or the guide pins 40 having steps 22 or steps 42 in the height direction" may mean that the steps 22 or the steps 42 face in the height direction.

In FIG. 5D, control pins 20 having steps 22 in the height direction are exemplified by A to D. In FIG. 5D, A is a plate-shaped control pin 20 thinner in the X-axis direction and having a single step 22, B is a plate-shaped control pin 20 thinner in the Y-axis direction and having a plurality of steps 22, C is a plate-shaped control pin 20 thinner in the Y-axis direction having a single step 22, and D is a plate-shaped control pin 20 thinner in the X-axis direction and having a plurality of steps 22. Any of the examples A to D has a step(s) 22 in the height direction.

On the other hand, the examples E and F in FIG. 5D are examples where steps 22 do not face in the height direction. The example E and F are not control pins 20 having steps 22 in the height direction. The examples E and F do not function as control pins 20 in the first place.

Figure 6:
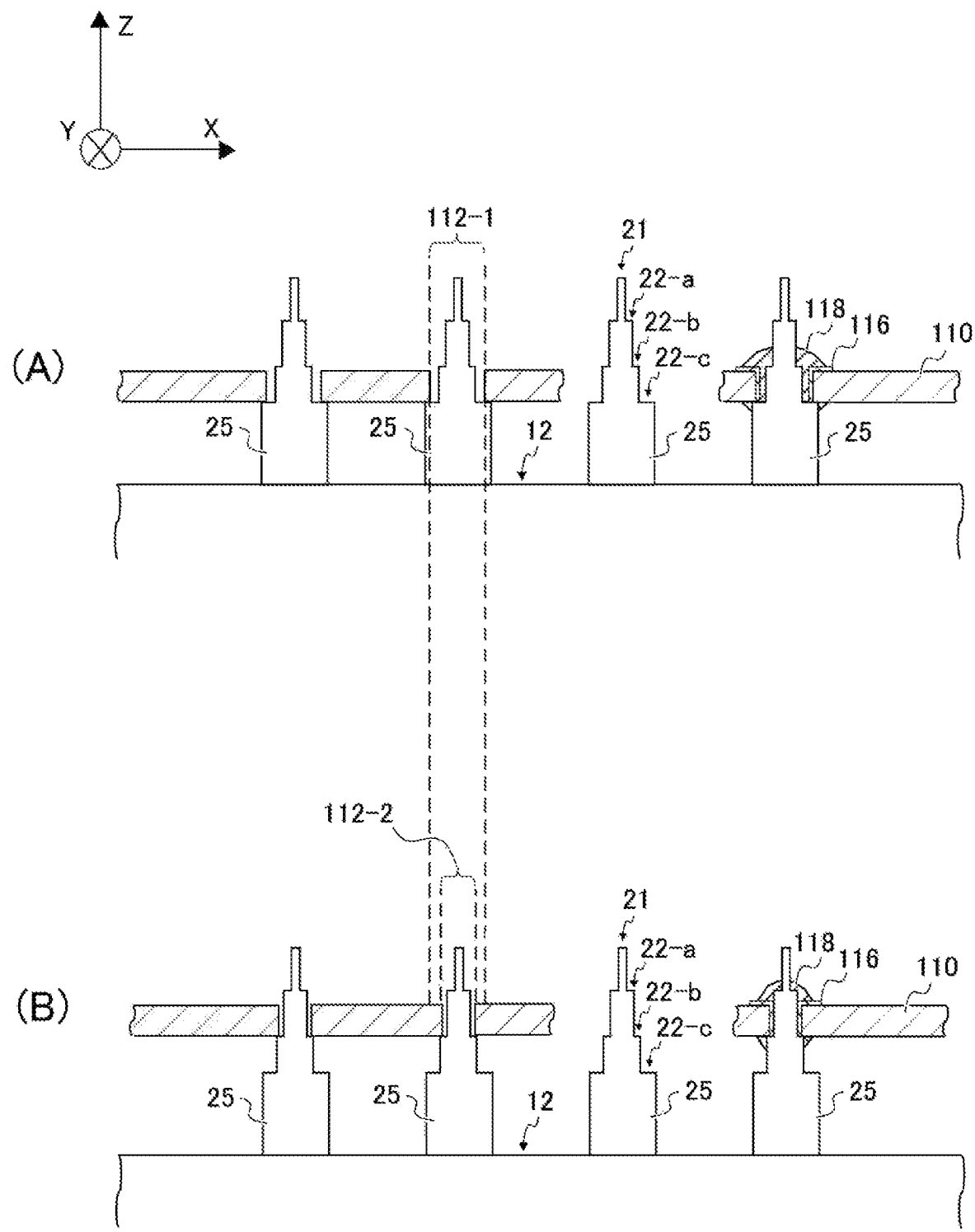
FIG. 6 shows an example where a control board 110 is provided in contact with different steps 22 of multi-step pins 25.

FIG. 6 shows an example where the control board 110 is provided in contact with different steps 22 of multi-step pins 25. FIG. 6 shows multi-step pins 25, all of which have the same shape. FIG. 6 is a view of the multi-step pins 25 sectioned by a plane parallel to the X-Z plane. FIG. 6 (A) shows an example where the control board 110 is provided on steps 22-*c*. In FIG. 6 (A), the control board 110 has openings 112-1, all of which have the same shape. In FIG. 6 (A), each opening 112-1 of the control board 110 is larger than the X-axis direction length of the multi-step pin 25 at the height position of its step 22-*b*, and smaller than the X-axis direction length of the multi-step pin 25 at the height position of its step 22-*c*.

Note that, for the purpose of easy understanding, a wiring 116 for the control board 110 and a solder 118 to electrically connect a multi-step pin 25 and the wiring 116 to each other are shown only in the vicinity of the multi-step pin 25 at the right end. Wirings 116 and solders 118 in the vicinity of other three multi-step pins 25 are omitted on purpose.

FIG. 6 (B) shows an example where the control board 110 is provided on steps 22-*b*. In FIG. 6 (B), the control board 110 has openings 112-2, all of which have the same shape. In FIG. 6 (B), the openings 112-2 of the control board 110 are smaller than the openings 112-1 in FIG. 6 (A). More specifically, each opening 112-2 is larger than the X-axis direction length of the multi-step pin 25 at the height position of its step 22-*a*, and smaller than the X-axis direction length of the multi-step pin 25 at the height position of its step 22-*b*. In FIG. 6 (B), the control board 110 is supported by the steps 22-*b* that are at a higher position than the steps 22-*c*.

As shown in FIG. 6, by changing the X-axis direction lengths of the openings 112 of the control board 110, the height position of the control board 110 can be changed without changing the control pins 20 themselves provided to the power semiconductor module 100. Note that, if a plurality of openings 112 having different X-axis direction lengths are mixedly present in the control board 110, the clearance 13 is determined by the step 22 of the multi-step pin 25 corresponding to an opening 112 having a smaller X-axis direction length. In the example of FIG. 6, the multi-step pins 25 have a plate shape having a smaller thickness in the Y-axis direction, but the multi-step pins 25 may have a plate shape having a smaller thickness in the X-axis direction in other examples.

Figure 7:
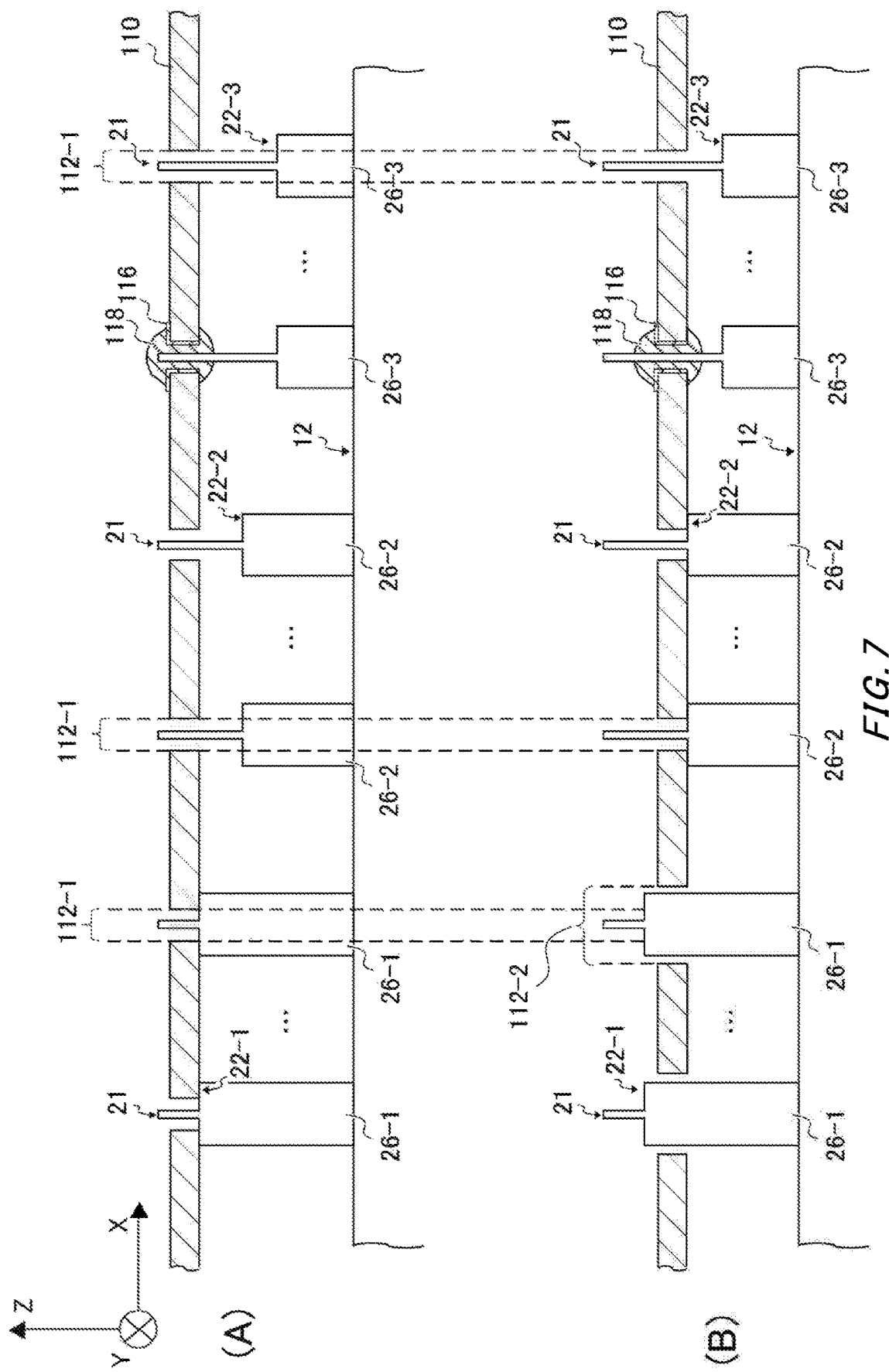
FIG. 7 shows an example where the control board 110 is provided in contact with steps 22 of single-step pins 26 having steps 22 at different positions.

FIG. 7 shows an example where the control board 110 is provided in contact with steps 22 of single-step pins 26 having steps 22 at different positions. FIG. 7 is a view of the single-step pins 26 sectioned by a plane parallel to the X-Z plane. In a manner similar to the multi-step pins 25, the single-step pins 26 are also an example of the control pins 20. FIG. 7 (A) shows an example where the control board 110 is provided on steps 22-1 of first single-step pins 26-1. FIG. 7 (B) shows an example where the control board 110 is provided on steps 22-2 of second single-step pins 26-2.

Each first single-step pin 26-1 has a single step 22-1 at a first height position, each second single-step pin 26-2 has a single step 22-2 at a second height position, and each third single-step pin 26-3 has a single step 22-3 at a third height position. The first height position, the second height position and the third height position are different from each other. In the present example, the second height position is lower than the first height position. Also, the third height position is lower than the second height position.

In the present example, the height position of the control board 110 can be adjusted by changing the X-axis direction lengths of the openings 112-1 corresponding to the first single-step pins 26-1. The X-axis direction lengths of the openings 112-1 corresponding to the first single-step pins 26-1 in FIG. 7 (A) are smaller than the X-axis direction lengths of the steps 22-1, and the X-axis direction lengths of the openings 112-2 corresponding to the first single-step pins 26-1 in FIG. 7 (B) are greater than the X-axis direction lengths of the steps 22-1.

However, the X-axis direction lengths of the openings 112-1 corresponding to the second single-step pins 26-2 and the third single-step pins 26-3 are the same in FIGS. 7 (A) and (B). In FIG. 7 (B), the clearance 13 is defined by the steps 22-2 of the second single-step pins 26-2. If the openings 112-2 correspond to the first single-step pins 26-1 and the second single-step pins 26-2, and the openings 112-1 correspond to the third single-step pins 26-3, the clearance 13 may be defined by the steps 22-3 of the third single-step pins 26-3.

At a control pin 20 having its step 22 at a relatively low height position, backlash may occur in the opening 112 of the control board 110. At a control pin 20 with backlash, the electrical connection required for operation of the power semiconductor module 100 can be unreliable. In order to ensure appropriate operation of the power semiconductor module 100, it is required that control pins 20 that function as any of supply voltage pins, gate control pins and ground pins are securely electrically connected to the power semiconductor module 100.

On the other hand, the power semiconductor module 100 can be configured to prevent abnormal operation even if the alarm pins and the power semiconductor module 100 are not electrically connected to each other. It is because the alarm pins merely have a function to inform the outside of abnormality in the power semiconductor module 100, and a protection function is designed to work in the power semiconductor module 100 in the case of occurrence of an abnormal operation.

Thus, in the present example, the second single-step pins 26-2 or the third single-step pins 26-3 are used as alarm pins. More preferably, the third single-step pins 26-3 having steps 22 at the lowest height position are used as alarm pins. In this manner, for control pins 20 other than the alarm pins (the first single-step pins 26-1 and the second single-step pins 26-2, for example), the electrical conduction required for operation of the power semiconductor module 100 can be more securely ensured. Note that, in the example of FIG. 7, the single-step pins 26 have a plate shape having a smaller thickness in the Y-axis direction, but the single-step pins 26 may have a plate shape having a smaller thickness in the X-axis direction in other examples.

Figure 8:
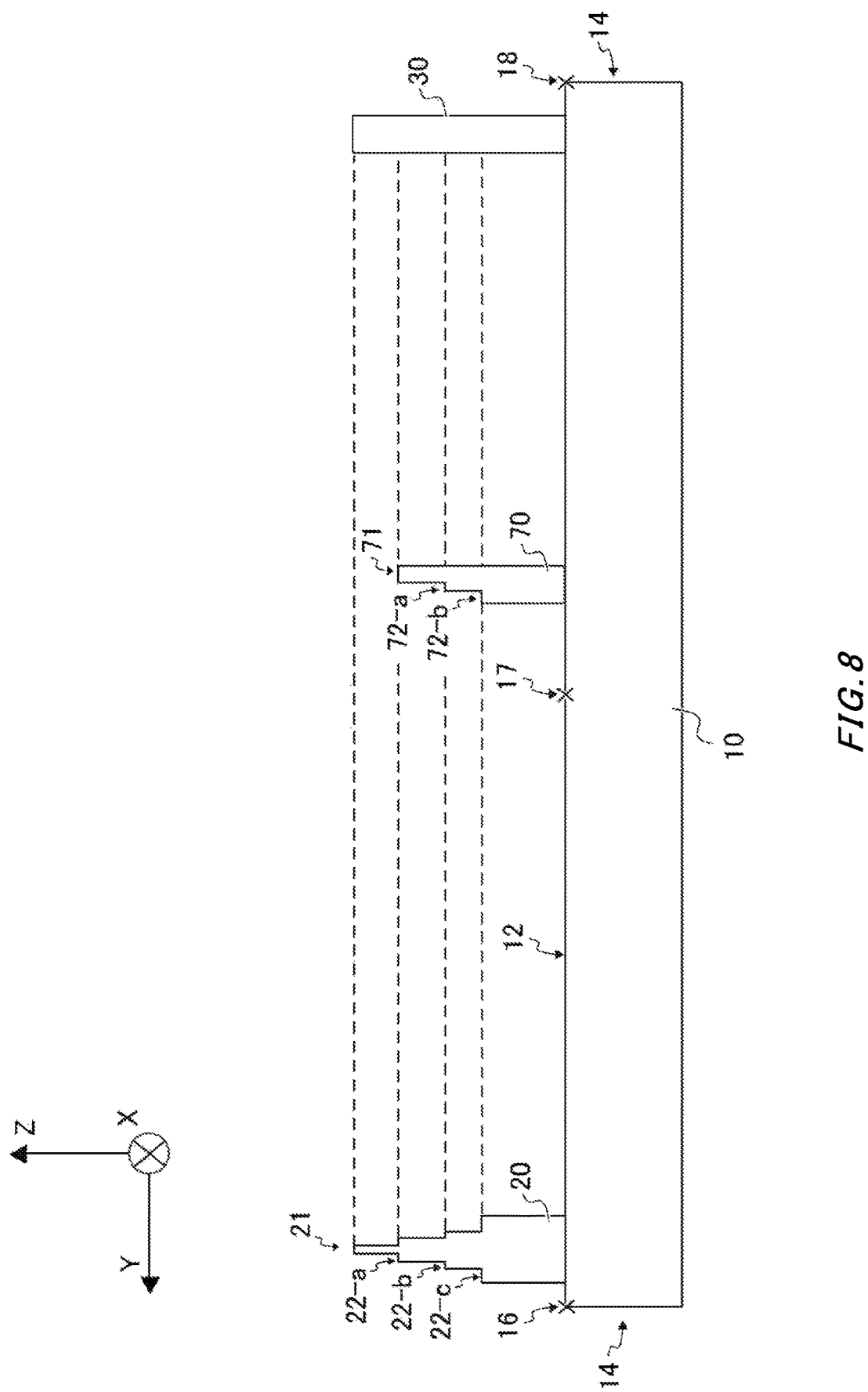
FIG. 8 shows an example where a plurality of steps 72 are provided to a projection 70.

FIG. 8 shows an example where a plurality of steps 72 are provided to a projection 70. FIG. 8 is also a view of a side surface 14 of the housing 10 as seen in the X-axis direction. FIG. 8 shows one control pin 20 positioned in the vicinity of the first side 16, one projection 70 positioned in the vicinity of the center line 17 and a main-current pin 30 positioned in the vicinity of the second side 18.

The projection 70 of the present example has at least one step 72 in the height direction. The projection 70 of the present example may be the same as the projection 60 described with reference to FIG. 3 except for having the step 72. The projection 70 of the present example has two steps 72 protruding in the positive Y-axis direction. In the present example, a step 72-a of the projection 70 at the highest position is at the same height position as a step 22-b of the control pin 20 at the second highest position. Also, a step 72-b of the projection 70 at the second highest position is at the same height position as a step 22-c of the control pin 20 at the lowest position. Note that the expression "the projection 70 having the steps 72 in the height direction" may mean that the steps 72 face in the height direction.

If the control board 110 contacts the step 22-a of the control pin 20, the control board 110 may contact a tip 71 of the projection 70. That is, the height position of the tip 71 may be the same as the height position of the step 22-a of the control pin 20. Also, if the control board 110 contacts the step 22-b of the control pin 20, the control board 110 may contact the step 72-a of the projection 70 at an opening portion for the projection 70. Thus, in the present example, the projection 70 as well as the control pin 20 contributes to adjustment of the height position of the control board 110 while the clearance 13 between the housing 10 and the control board 110 is made uniform in the entire X-Y plane by the projection 70. Note that, if a plurality of projections 70 are provided, the plurality of projections 70 may be arranged along the X-axis direction, in a manner similar to a plurality of projections 60 in FIG. 3.

Figure 9:
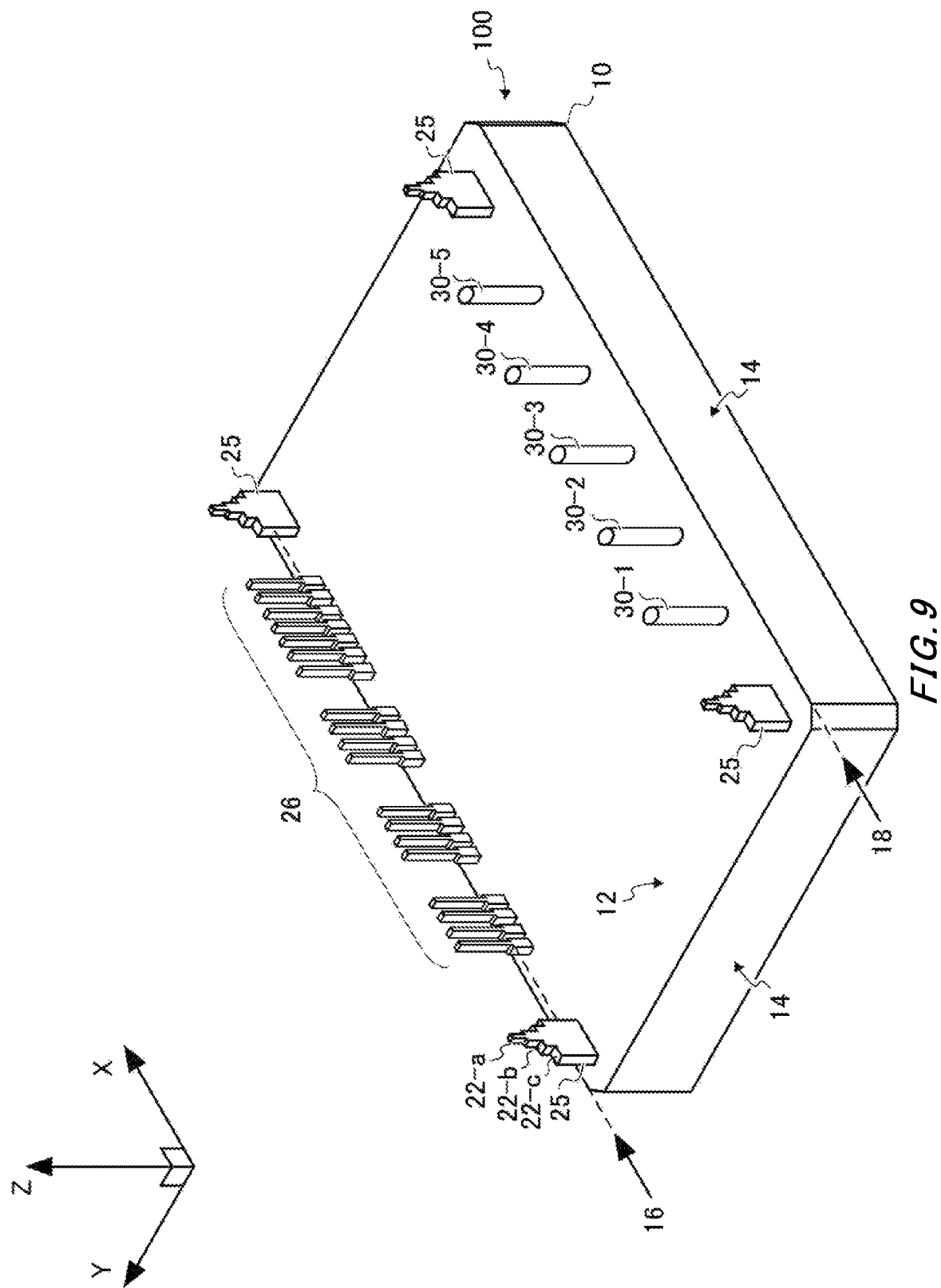
FIG. 9 is a perspective view of the power semiconductor module 100 according to a second embodiment.

FIG. 9 is a perspective view of the power semiconductor module 100 according to a second embodiment. The power semiconductor module 100 of the present example includes a plurality of control pins 20, a plurality of main-current pins 30 and a plurality of guide pins 40, in a manner similar to the first embodiment. However, the plurality of control pins 20 of the present example include multi-step pins 25 and single-step pins 26.

Each of the plurality of multi-step pins 25 may have two or more steps in the height direction. Each multi-step pin 25 of the present example has three steps in the same manner as the example of FIG. 5C. Each of the plurality of multi-step pins 25 may be provided at a corner of the upper surface 12 of the housing 10. In the present example, the multi-step pins 25 are arranged at the four corners of the upper surface 12.

In the present example, the X-axis direction lengths of the openings 112 of the control board 110 corresponding to the multi-step pins 25 are relatively greater than the X-axis direction lengths of the openings 112 of the control board 110 corresponding to the single-step pins 26. Specifically, the X-axis direction lengths of the multi-step pins 25 at the height position of the steps 22-a are greater than the X-axis direction lengths of the single-step pins 26 at the same height position as the steps 22-a. Note that the X-axis direction lengths of the multi-step pins 25 at the height position of the steps 22-a may be greater than the X-axis direction lengths of the single-step pins 26 at the steps 22.

In the present example, the multi-step pins 25, which have greater X-axis direction lengths at the height position of the steps 22 than the single-step pins 26, support the control board 110. In this manner, the clearance 13 between the housing 10 and the control board 110 can be made more stable. Although multi-step pins 25 may be provided at two corners of the upper surface 12, multi-step pins 25 are more preferably arranged at three corners, and further preferably arranged at all the (four) corners so that the clearance 13 can be more securely made stable.

The multi-step pins 25 may function as alarm pins. In the present example, the alarm pins are arranged at the four corners of the upper surface 12. On the other hand, the single-step pins 26 each having a single step 22 do not function as alarm pins. In the present example, each of the plurality of single-step pins 26 functions as any of a supply voltage pin, a gate control pin and a ground pin. In the present example, the clearance 13 can be made stable by the multi-step pins 25, and therefore the electrical connection between the single-step pins 26 and the control board 110 can be improved compared to the case where the clearance 13 between the housing 10 and the control board 110 is defined only by the single-step pins 26.

Note that, although the multi-step pins 25 and the single-step pins 26 have a plate shape having a smaller thickness in the Y-axis direction in the example of FIG. 9, either or both of the multi-step pins 25 and the single-step pins 26 may have a plate shape having a smaller thickness in the X-axis direction in other examples. In an example where the multi-step pins 25 have a plate shape having a smaller thickness in the Y-axis direction and the single-step pins 26 have a plate shape having a smaller thickness in the X-axis direction, the X-axis direction lengths of the multi-step pins 25 at the height position of the steps 22-a may be greater than the Y-axis direction lengths of the single-step pins 26 at the same height position as the steps 22-a.

Figure 10:
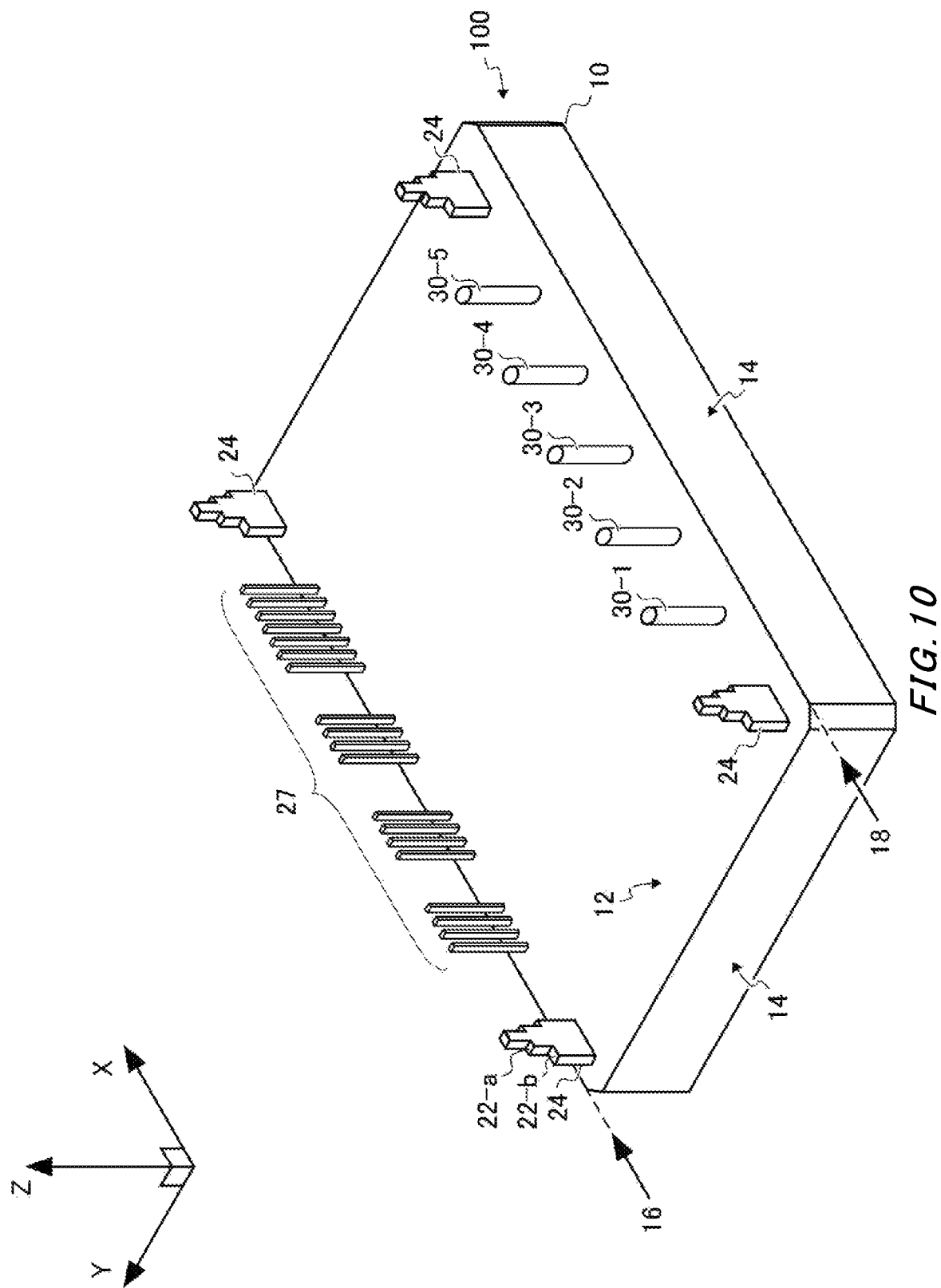
FIG. 10 is a perspective view of the power semiconductor module 100 according to a third embodiment.

FIG. 10 is a perspective view of the power semiconductor module 100 according to a third embodiment. The power semiconductor module 100 of the present example includes a plurality of control pins 20, a plurality of main-current pins 30 and a plurality of guide pins 40, in a manner similar to the first embodiment. However, the plurality of control pins 20 of the present example include step pins 24 each having at least one step 22 and straight pins 27 having a straight shape and having no step 22. The straight pins 27 may have a prismatic shape, or may have a cylindrical shape.

The step pins 24 of the present example are arranged at the four corners of the upper surface 12. In the present example, the step pins 24 define the clearance 13 between the housing 10 and the control board 110. The step pins 24 of the present example may be the multi-step pins 25 as in the second embodiment. Also, the step pins 24 of the present example function as alarm pins. On the other hand, the straight pins 27 of the present example are non-alarm pins having a function different from the alarm pins. Specifically, the straight pins 27 of the present example may function as any of supply voltage pins, gate control pins and ground pins.

In the present example, the lengths of the openings 112 of the control board 110 corresponding to the step pins 24 are relatively greater than the lengths of the openings 112 of the control board 110 corresponding to the straight pins 27. In the present example, the X-axis direction lengths of the step pins 24 at the height position of the steps 22-a are greater than the X-axis direction lengths of the straight pins 27 at the same height position as the steps 22-a.

In the present example, the step pins 24, which have greater X-axis direction lengths than the straight pins 27, support the control board 110. The arrangement of the step pins 24 may be the same as in the second embodiment. In the present example, the clearance 13 can be made stable by the step pins 24, and therefore the reliability in electrical contact between the straight pins 27 and the openings 112-4 can be improved.

Figure 11:
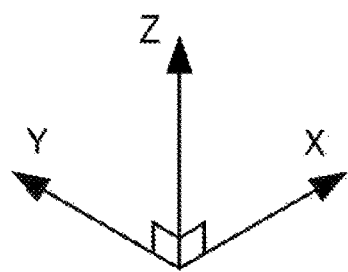
FIG. 11 is a perspective view of a control pin 20 having steps 22 only on one side surface.
Figure 11:
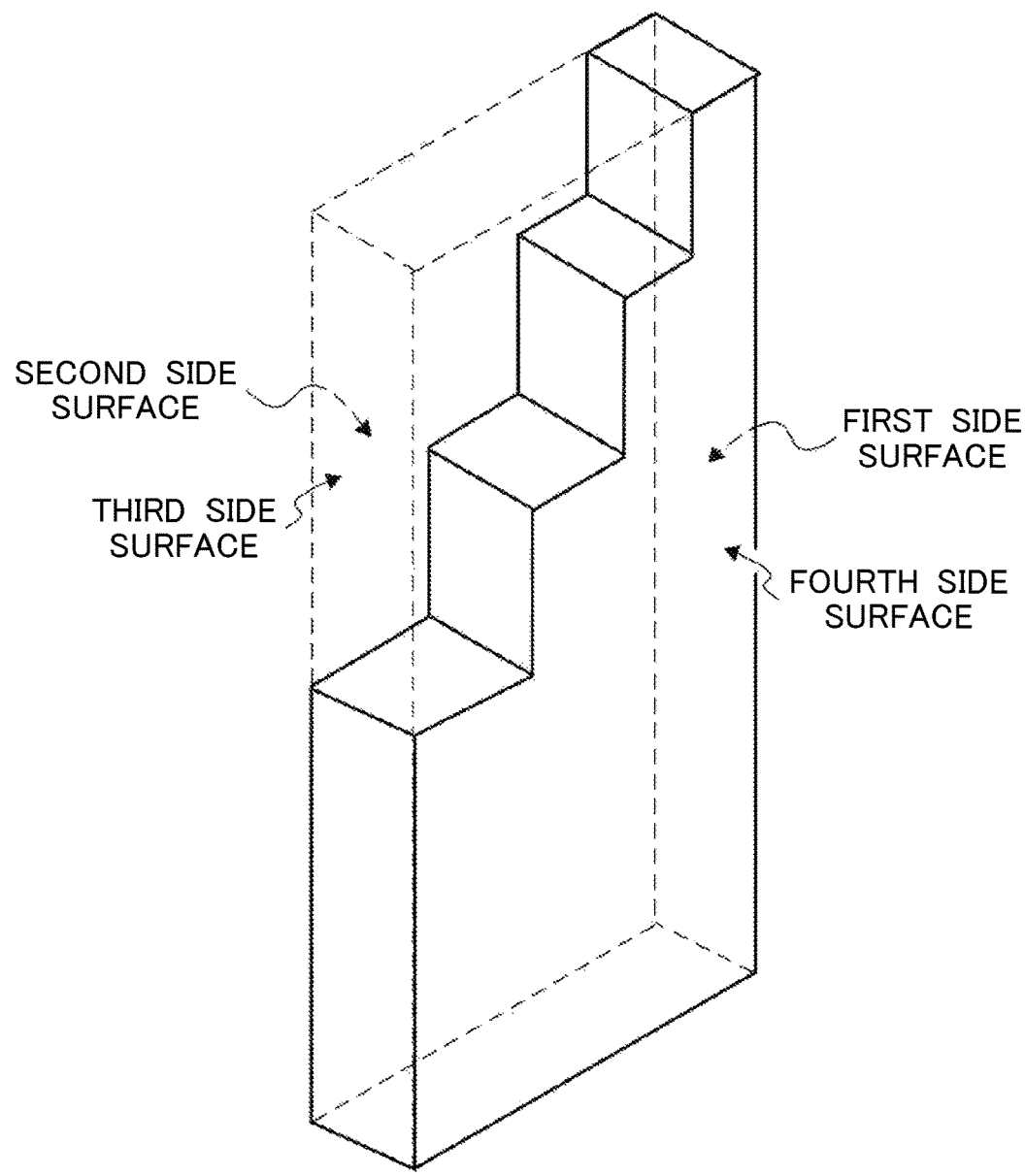
Figure 12:
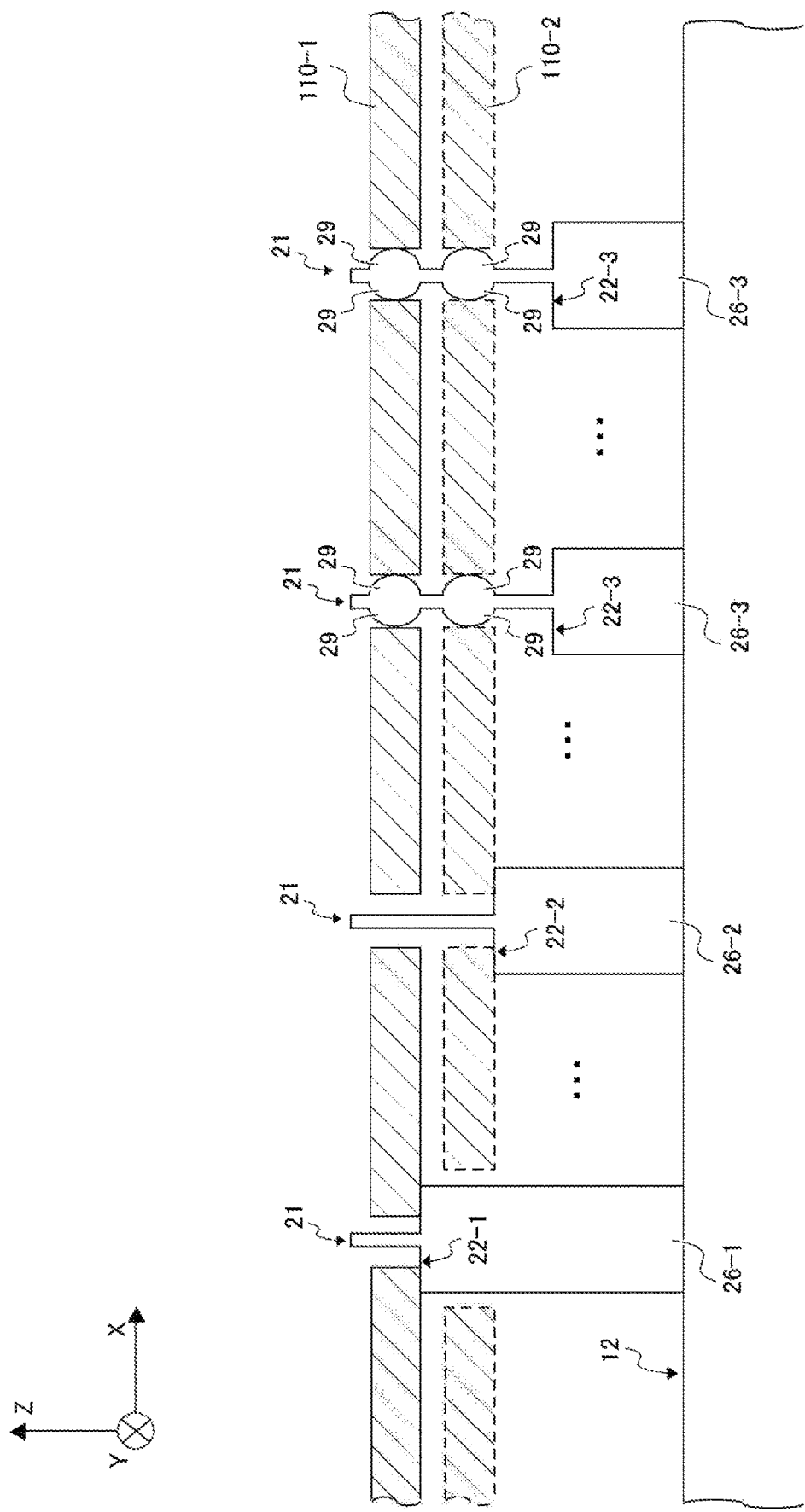
FIG. 12 shows an example where control pins 20 have convex portions 29.
Figure 13:
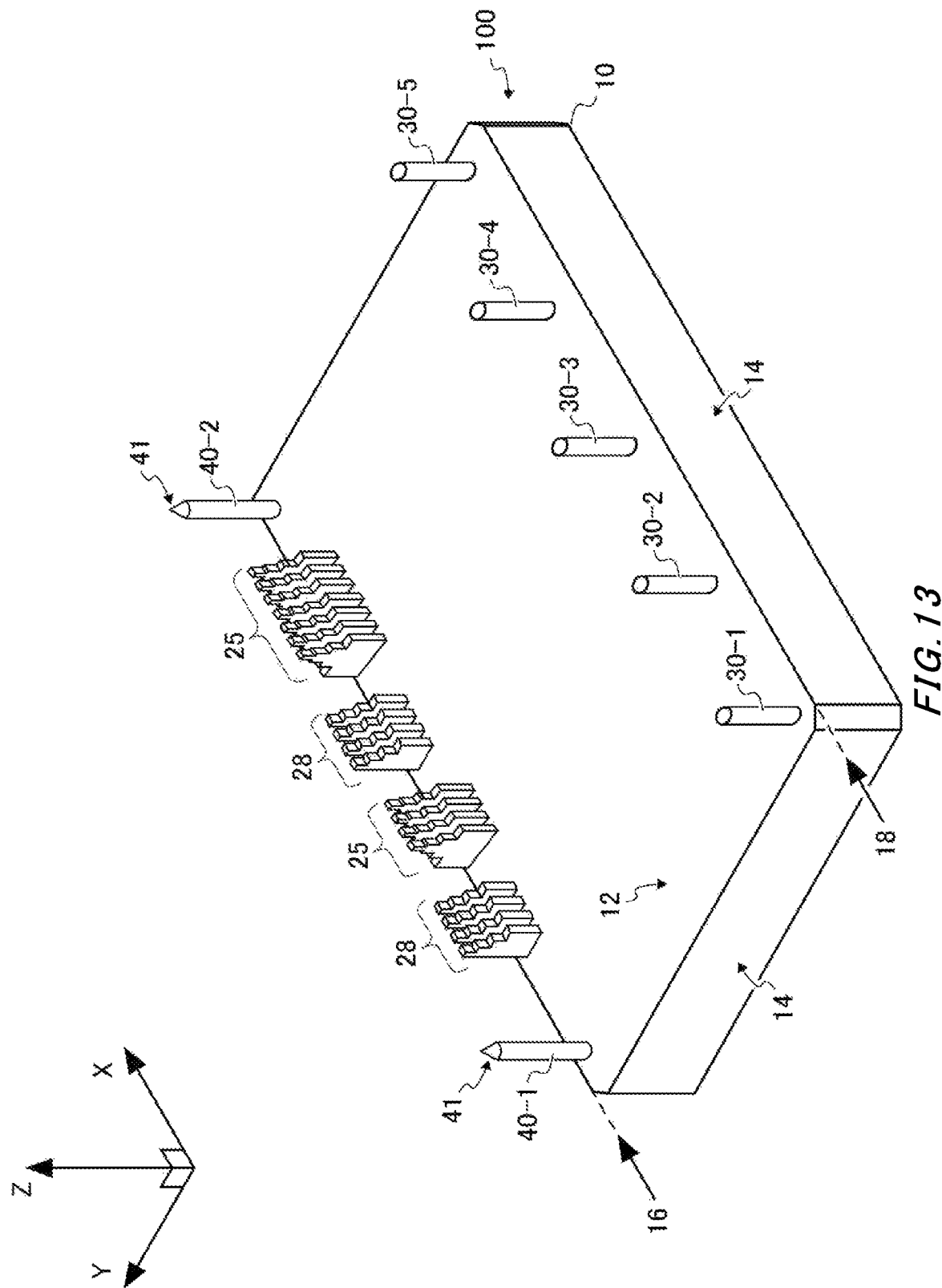
FIG. 13 shows an example where steps 22 of control pins 20 are in different directions.

FIGS. 11 to 13 show other examples of control pins 20. Combinations of the examples of FIGS. 11 to 13 and the second embodiment or the third embodiment may also be applied.

FIG. 11 is a perspective view of a control pin 20 having steps 22 only on one side surface (i.e. a stair-like pin 28). The dashed lines in FIG. 11 indicate the case where the control pin 20 is a plate-shaped pin having no step 22. Among four side surfaces of the control pin 20 indicated by the dashed lines, a first side surface faces in the positive X-axis direction, a second side surface faces in the positive Y-axis direction, a third side surface faces in the negative X-axis direction, and a fourth side surface faces in the negative Y-axis direction.

In the present example, toward the height direction, the third side surface becomes more concaved in the positive X-axis direction in a stair-like manner. In this manner, the stair-like pin 28 having a plurality of steps 22 only on one of the four side surfaces is formed. Note that, in the example of FIG. 11, the control pin 20 has a plate shape having a smaller thickness in the Y-axis direction, but the control pin 20 may have a plate shape having a smaller thickness in the X-axis direction in other examples.

FIG. 12 shows an example where control pins 20 have convex portions 29. Each control pin 20 of the present example is a single-step pin 26 having a single step 22. In a manner similar to the example of FIG. 7, each first single-step pin 26-1 has a single step 22-1 at a first height position, each second single-step pin 26-2 has a single step 22-2 at a second height position, and each third single-step pin 26-3 has a single step 22-3 at a third height position. The height positions are such that the first height position is the highest, followed in order by the second height position and the third height position.

In FIG. 12, a control board 110-1 to contact a step 22-1 is indicated by solid lines, and a control board 110-2 to contact a step 22-2 is indicated by dashed lines. The third single-step pins 26-3 of the present example have convex portions 29 protruding in the Y-axis direction at the same height positions as the first and the second height positions. Note that the convex portions 29 may protrude in either the X-axis direction or the Y-axis direction, or may protrude in both the X-axis direction and the Y-axis direction. The convex portions 29 may be annular as seen from above. The first single-step pin 26-1 and the second single-step pin 26-2 are examples of a first control pin, and the third single-step pins 26-3 are examples of a second control pin.

In the present example, if the control board 110 contacts the step 22-1 or the step 22-2, the third single-step pins 26-3 can also contribute to defining the clearance 13 between the housing 10 and the control board 110. Therefore, the clearance 13 can be more securely made stable compared to the case of single-step pins 26 having no convex portion 29.

Note that, in other examples, the second single-step pin 26-2 may have a convex portion 29 at the same position as the first height position. Also, in the example of FIG. 12, the single-step pins 26 have a plate shape having a smaller thickness in the Y-axis direction, but the single-step pins 26 may have a plate shape having a smaller thickness in the X-axis direction in other examples.

FIG. 13 shows an example where steps 22 of control pins 20 are in different directions. Each control pin 20 of the present example is a plate-shaped pin that is longer in the Y-axis direction than in the X-axis direction. That is, each control pin 20 of the present example is a plate-shaped pin having a smaller thickness in the X-axis direction. As the plate-shaped pins having a smaller thickness in the X-axis direction are arranged along the X-axis direction, the control pins 20 are unlikely to contact with each other even if the pitch intervals between the control pins 20 are narrowed. In this manner, the degree of freedom of layout of the control pins 20 is improved.

The control pins 20 of the present example include multi-step pins 25 and stair-like pins 28. The multi-step pins 25 are examples of a first plate-shaped pin, and the stair-like pins 28 are examples of a second plate-shaped pin.

The multi-step pins 25 may have steps 22 at least protruding in the positive Y-axis direction. The stair-like pins 28 have a shape different from the multi-step pins 25. Each stair-like pin 28 of the present example has a plurality of steps protruding in the negative Y-axis direction. In this manner, the tips 21 of the stair-like pins 28 can always be arranged closer to the first side 16 rather than to the center line 17 in the present example.

The height position of each of the plurality of steps 22 of the stair-like pins 28 may be the same as the height position of any step 22 of the multi-step pins 25. Steps 22 of the stair-like pins 28 and the multi-step pins 25 at the same height position may define the clearance 13 between the housing 10 and the control board 110.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: housing, 12: upper surface, 13: clearance, 14: side surface, 16: first side, 17: center line, 18: second side, 20: control pin, 21: tip, 22: step, 23: tip side surface, 24: step pin, 25: multi-step pin, 26: single-step pin, 27: straight pin, 28: stair-like pin, 29: convex portion, 30: main-current pin, 40: guide pin, 41: tip, 42: step, 50: semiconductor chip, 60: projection, 61: tip, 70: projection, 71: tip, 72: step, 100: power semiconductor module, 110: control board, 112: opening, 113: inner surface, 114: opening, 115: opening, 116: wiring, 118: solder, 200: power semiconductor device

What is claimed is:

1. A power semiconductor module comprising:
a housing which houses a power semiconductor chip;
a plurality of control pins which protrude outward from an upper surface of the housing, and establish a direct electrical connection between the power semiconductor chip and a control board, at least one of the plurality of control pins being electrically connected to a driver IC to transfer a supply voltage to the driver IC or a control signal to control operation of the power semiconductor chip; and
at least one guide pin which protrudes outward from the upper surface of the housing, wherein
each of the plurality of control pins has at least one step in a height direction from the upper surface of the housing toward a tip farthest from the housing, the at least one step contacting a back surface of the control board, and
a maximum diameter of each of the plurality of control pins is smaller than a maximum diameter of the at least one guide pin.

2. The power semiconductor module according to claim 1, wherein
the upper surface of the housing has a first side and a second side opposing each other,
the plurality of control pins are arranged along the first side of the upper surface of the housing, and
the housing has one or more projections which are provided in a region closer to the second side than to the first side on upper surface and are formed of resin.

3. The power semiconductor module according to claim 2, wherein a height position of a tip of each of the one or more projections is same as a height position of the at least one step of each of the control pins.

4. The power semiconductor module according to claim 2, wherein a height position of a tip of the one or more projections is the same as a height position of the at least one step of the plurality of control pins.

5. The power semiconductor module according to claim 1, wherein the plurality of control pins includes at least one control pin having two or more steps.

6. The power semiconductor module according to claim 1, wherein
the plurality of control pins includes:
a first control pin having a single step at a first height position; and
a second control pin having a single step at a second height position that is different from the first height position.

7. The power semiconductor module according to claim 6, wherein
the second height position is lower than the first height position, and
the second control pin is an alarm pin electrically connected to the driver IC to transfer a signal indicating an abnormality in the power semiconductor module.

8. The power semiconductor module according to claim 1, wherein
the upper surface of the housing has a first side and a second side opposing each other,
the housing has one or more projections which are provided in a region closer to the second side than to the first side on the upper surface and are formed of resin, and
each of the one or more projections has at least one step in the height direction.

9. The power semiconductor module according to claim 1, wherein
the plurality of control pins include:
a multi-step pin which has two or more steps in the height direction, is provided at a corner of the upper surface of the housing, and functions as an alarm pin electrically connected to the driver IC to transfer a signal indicating an abnormality in the power semiconductor module; and
a single-step pin which has a single step and does not function as the alarm pin.

10. The power semiconductor module according to claim 1, wherein
the plurality of control pins include:
an alarm pin which has at least one step in the height direction and is electrically connected to the driver IC to transfer a signal indicating an abnormality in the power semiconductor module; and
a non-alarm pin which has a straight shape with no step and has a function different from the alarm pin.

11. The power semiconductor module according to claim 1, wherein
the plurality of control pins include a plate-shaped pin having a step only on one of four side surfaces.

12. The power semiconductor module according to claim 1, wherein the plurality of control pins include:
a first control pin having the at least one step at a first height position; and
a second control pin having, at a same height position as the first height position, a convex portion protruding in a direction orthogonal to the height direction.

13. The power semiconductor module according to claim 1, wherein
the plurality of control pins are arranged along a first direction,
the plurality of control pins include a plurality of plate-shaped pins which are longer in a second direction orthogonal to the first direction than in the first direction as seen from above, and
the plurality of plate-shaped pins each have at least one step protruding in the second direction.

14. The power semiconductor module according to claim 13, wherein
the plurality of plate-shaped pins include:
a first plate-shaped pin having a step in a positive direction of the second direction, and
a second plate-shaped pin which has a shape different from the first plate-shaped pin and has a step in a negative direction of the second direction.

15. The power semiconductor module according to claim 14, wherein the second plate-shaped pin has a plurality of steps.

16. A power semiconductor device comprising:
the power semiconductor module according to claim 1; and
the control board according to claim 1, the control board having an opening provided in correspondence with the at least one control pin and contacting the at least one control pin in the opening, wherein
the opening is an ellipse or an oval as seen from above.

17. The power semiconductor module according to claim 1, wherein the at least one step includes a surface that is parallel to the upper surface of the housing.

18. The power semiconductor module according to claim 1, wherein the plurality of control pins includes at least one control pin having three side surfaces that are flat and one side surface having the at least one step.

* * * * *